US009466862B2

United States Patent
Aoki

(10) Patent No.: US 9,466,862 B2
(45) Date of Patent: Oct. 11, 2016

(54) BATTERY STATE NOTIFYING UNIT, BUS BAR MODULE, BATTERY PACK, AND BATTERY STATE MONITORING SYSTEM

(71) Applicant: YAZAKI CORPORATION, Tokyo (JP)

(72) Inventor: Yoshihito Aoki, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 302 days.

(21) Appl. No.: 14/165,267

(22) Filed: Jan. 27, 2014

(65) Prior Publication Data

US 2014/0141301 A1 May 22, 2014

Related U.S. Application Data

(63) Continuation of application No. PCT/JP2012/068559, filed on Jul. 23, 2012.

(30) Foreign Application Priority Data

Jul. 27, 2011 (JP) .................... 2011-164227

(51) Int. Cl.
*H02J 7/00* (2006.01)
*H02H 7/18* (2006.01)
(Continued)

(52) U.S. Cl.
CPC ......... *H01M 10/482* (2013.01); *H01M 10/425* (2013.01); *G01R 31/3658* (2013.01);
(Continued)

(58) Field of Classification Search
CPC .................................. H01M 10/482

USPC ....... 320/109, 112, 104, 105, 107; 307/10.7; 429/163, 175, 177
See application file for complete search history.

(56) References Cited

U.S. PATENT DOCUMENTS 5,496,658 A * 3/1996 Hein .................... H01M 10/488
116/202
6,628,102 B2 * 9/2003 Batson .................. H02J 7/0047
320/128

(Continued)

FOREIGN PATENT DOCUMENTS

| EP | 2 299 517 A2 | 3/2011 |
| JP | 2007-59088 A | 3/2007 |

(Continued)

OTHER PUBLICATIONS

The extended European Search Report for the related European Patent Application No. 12818313.4 dated Mar. 25, 2015.

(Continued)

*Primary Examiner* — Richard V Muralidar
(74) *Attorney, Agent, or Firm* — Kenealy Vaidya LLP

(57) ABSTRACT

Disclosed are a battery state notifying unit readily exchangeble between battery packs differing in the number of battery cell, a bus bar module and a battery pack including the battery state notifying unit, and a battery state monitoring system including the battery state notifying unit. The battery state notifying unit includes a plurality of subunits corresponding to every battery cell, and the subunits in accordance with a cell temperature signal corresponding to a voltage outputted by a bus bar and a terminal fitting, generates a battery state data composed of a digital signal including a data indicating a state of the battery cell corresponding to the subunit, and transmits the battery state data to the external battery state monitoring unit.

2 Claims, 15 Drawing Sheets

(51) Int. Cl.
*H01M 10/48* (2006.01)
*H01M 10/42* (2006.01)
*G01R 31/36* (2006.01)

(52) U.S. Cl.
CPC ........ *G01R31/3689* (2013.01); *H01M 10/486* (2013.01); *H01M 2010/4278* (2013.01); *H01M 2220/20* (2013.01)

(56) References Cited

U.S. PATENT DOCUMENTS 7,164,272 B1 * 1/2007 Borrego Bel ....... B60R 16/0239
 324/426
7,205,746 B2 * 4/2007 Batson .................. H02J 7/0047
 320/107
2008/0180106 A1 * 7/2008 Gorbold ............. G01R 31/3658
 324/434

FOREIGN PATENT DOCUMENTS

JP 2010-3627 A 1/2010
WO 2009/091349 A2 7/2009

OTHER PUBLICATIONS

Japanese Office Action for the related Japanese Patent Application No. 2011-164227 dated Mar. 10, 2015.

* cited by examiner

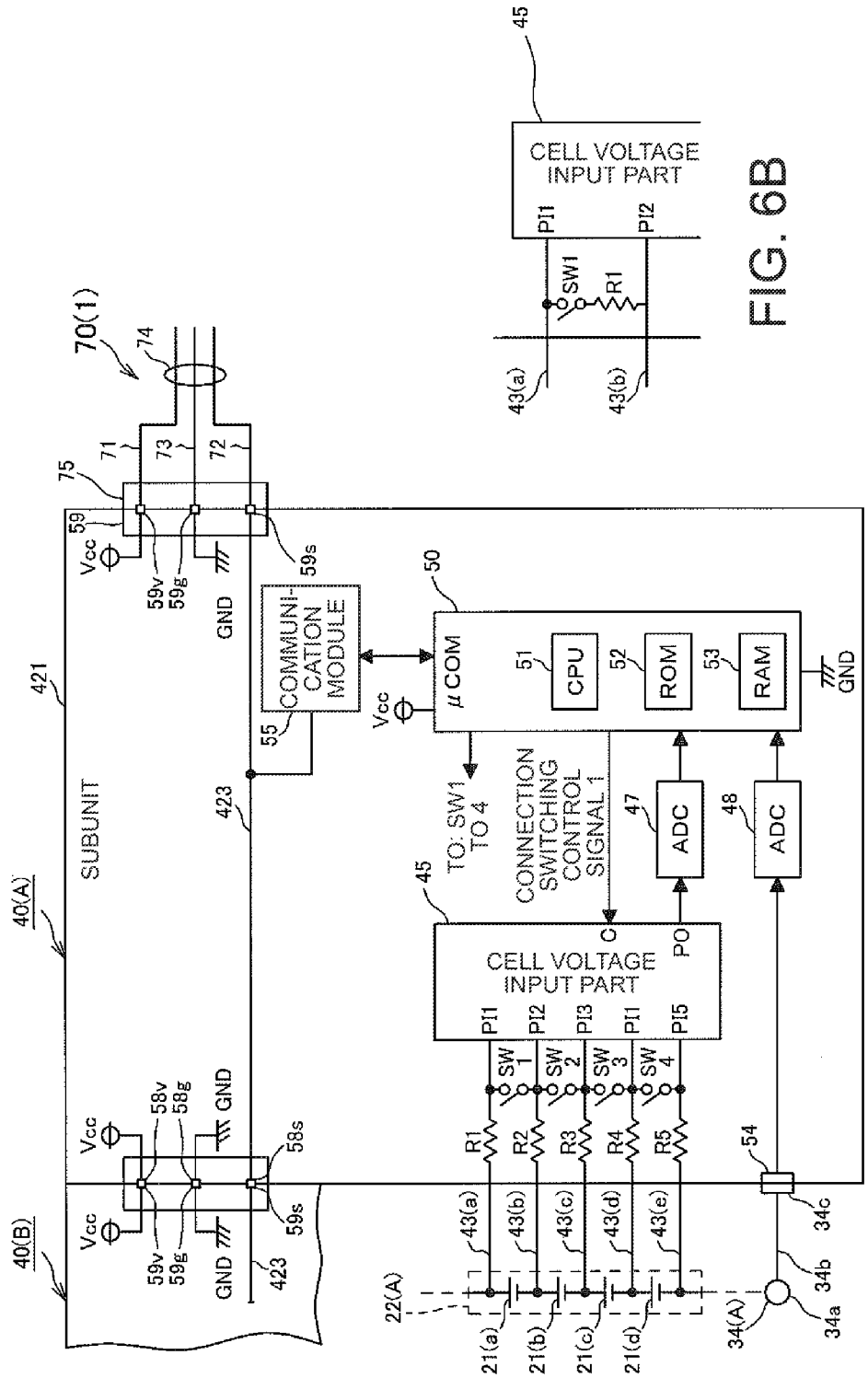

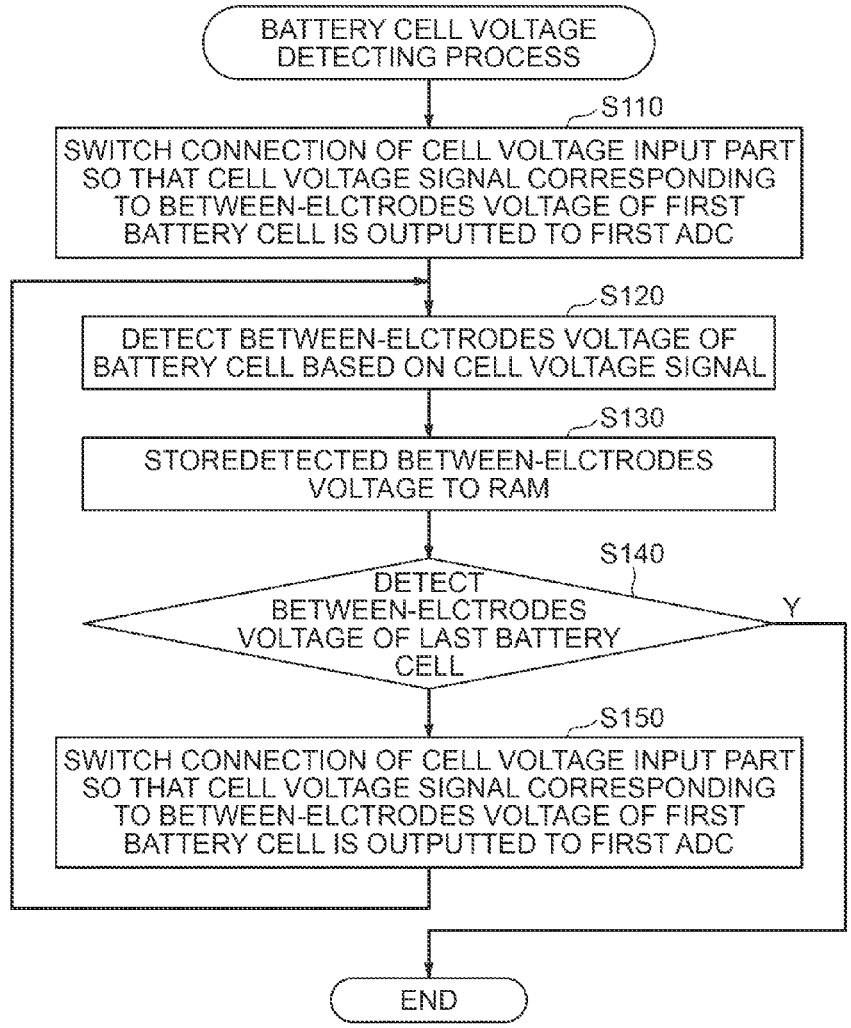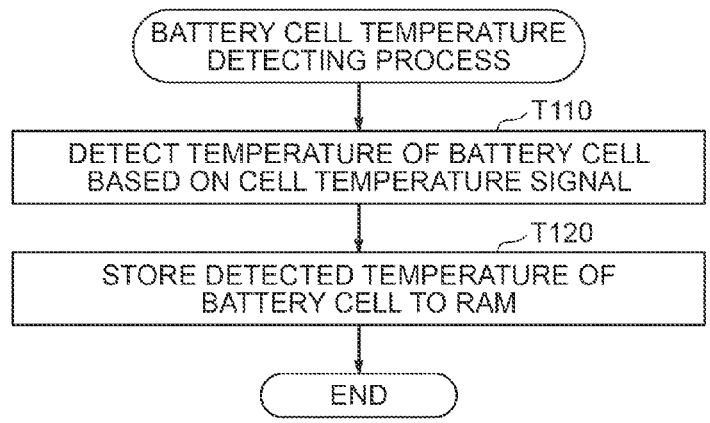

BATTERY STATE NOTIFYING UNIT, BUS BAR MODULE, BATTERY PACK, AND BATTERY STATE MONITORING SYSTEM

TECHNICAL FIELD

This invention is related to battery state notifying units used for monitoring a state of a battery pack adapted to be mounted to a hybrid vehicle or an electric vehicle for example, bus bar modules and battery packs including the battery state notifying units, and battery state monitoring systems including the battery state notifying units.

BACKGROUND ART

Recently, there have been prevailed a hybrid vehicle running concomitantly with an engine and an electric motor (hereafter referred to as HEV), or an electric vehicle running only with electric motor. For example, HEV is provided with a low-voltage battery about 12 V for starting the aforementioned electric motor and actuating electric components in the vehicle, and a high-voltage battery for driving the aforementioned electric motor. The aforementioned high-voltage battery includes secondary battery such as nickel hydride battery or lithium battery as unit cell (that is, battery cell) and has this unit cell connected in series in the plural to compose a battery pack so as to obtain high-voltage (see PTL 1 for example).

The aforementioned high-voltage battery has variation induced in a between-electrodes voltages of each unit cell, i.e., a state of charge (SOC) as repeating charge and discharge. Charge and discharge for high-voltage battery is required, in view of tolerance or safety of each unit cell, to prohibit charging when the unit cell with the highest between-electrodes voltage reaches a predetermined upper limit voltage, and to prohibit discharging when the unit cell with the lowest between-electrodes voltage reaches a predetermined lower limit. Therefore, in an abnormal state in which each unit cell induces variation of SOC, usable capacity of the battery is substantially reduced. Thereby, in the aforementioned high-voltage battery it is required that the unit cell with higher between-electrodes voltage is discharged separately from the aforementioned electric motor drive, and that the SOC of each unit cell is equalized to return to its normal state. In order to equalize the SOC of each unit cell, it is required to monitor the between-electrodes voltage of each unit cell.

Furthermore, as the aforementioned high-voltage battery generates a great deal of heat by discharging large current upon driving the electric motor, the battery, if a part of unit cell has such a defect, may lie in abnormal state of high temperature exceeding allowable upper limit temperature. Thereby, in order to obviate this abnormal state by stopping discharging before such abnormal state of high temperature arises, it is required to monitor temperature of the high-voltage battery. Furthermore, variation of the battery temperature has the aforementioned between-electrodes voltage varied, requiring compensation for the aforementioned between-electrodes voltage for temperature.

FIG. 16 illustrates a high-voltage battery system that is a conventional battery state monitoring system.

This high-voltage battery system (shown by reference sign 801 in the figure) is provided with a high-voltage battery 810 as a plurality of battery packs, a battery state monitoring device 850 monitoring a state of the high-voltage battery 810.

The high-voltage battery 810 is provided with a battery module 820 including a plurality of battery cells 821 arranged in one direction, a bus bar module 830 arranged overlaid on an upper face of the battery module 820, a wiring harness 840 including a connector plug 841 and a plurality of cables 842.

The bus bar module 830 is provided with a plurality of bus bars 831. The plurality of bus bars 831 has a plurality of battery cells 821 coupled in series entirely by connecting positive and negative electrodes of the battery cell 821 adjacent to each other. The bus bar module 830 is also provided with a plurality of temperature sensors 832 at a middle and both ends in the one direction (namely, arrangement direction of the plurality of battery cells 821) that outputs voltage in accordance with the measured temperature.

The plurality of cables 842 of the wiring harness 840 has one ends thereof each connected to not-shown terminals within the connector plug 841, and has the other ends thereof each connected to a plurality of terminal fittings 833 that are connected to electrode of the battery cell 821 as by overlaying on the plurality of bus bars 831, and the aforementioned temperature sensor 832.

The battery state monitoring device 850 is provided with, for example, a box-type case 851, a controller (not shown) composed of such a microprocessor housed in the case 851. The case 851 is provided with a connector socket (not shown) adapted to engage with the connector plug 841 of the wiring harness 840 that is exposed from the case 851. Engagement of the aforementioned connector plug 841 with the connector socket allows the controller and the wiring harness 840 (that is, the aforementioned terminal fitting 833 and the aforementioned temperature sensor 832) to connect.

Thereby, the controller, in accordance with a voltage outputted from the plurality of terminal fittings 833 and the aforementioned temperature sensor 832, detected temperature of the between-electrodes voltages of the plurality of battery cells and the battery cell, and monitored whether each battery cell 810 lies in normal state or not.

Disadvantageously, the aforementioned high-voltage battery system 801 needed a number of plurality of cables 842 according to that of battery cell 821, and needed a enlarged space for wiring the wiring harness 840 because of the plurality of cables 842 being pulled out of the battery cell 821 and being wired to the battery state monitoring device 850 as it is, resulting in difficulty of wiring design and wiring work. Furthermore, while the electrode voltage of the battery cell 821 is inputted to the battery state monitoring device 850 via the wiring harness 840, this electrode voltage of this battery cell 821 may become high-voltage of several hundred volts in potential difference from reference potential such as car body, requiring design for safety/reliability such as insulation resistance or noise resistance in view of mixture of high-voltage as such and low-voltage for controlling, which made it difficult to design electrically such devices.

Thereby there has been advocated as a configuration to resolve these problems a battery state monitoring system as shown in FIG. 17 (shown by reference sign 901 in the figure).

The battery state monitoring system 901 is provided with a battery pack 910 as a plurality of battery packs, a battery state monitoring unit 960 monitoring the state of the plurality of battery packs 910, a wiring harness 970 connecting the plurality of battery packs 910 and the battery state monitoring unit 960.

The battery pack 910 is provided with a battery module 920 composed of a plurality of battery cells 921 arranged in line, a plurality of bus bars 932, a plurality of terminal fittings 933, and a bus bar module 930 including a plurality of temperature sensors 934 and a battery state notifying unit 940. In the bus bar module 930 disposed to each battery pack 910, the battery state notifying unit 940 generates a battery state data in accordance with a cell temperature signal according to a voltage outputted from the cell voltage signal and the temperature sensor 934 that is based on the between-electrodes voltages of the battery cell 921 outputted from the terminal fitting 933 of the battery pack 910, which the battery state data is composed of a digital signal including data indicating between-electrodes voltages and temperature of the battery cell 921, and transmits the battery state data to the battery state monitoring unit 960.

It follows from this that in the battery state monitoring unit 960, the state of the battery pack 910 can be monitored based on the battery state data transmitted from the battery state notifying unit 940 of each battery pack 910, and thereby it is made possible to reduce the number of the plurality of cables in the wiring harness 970 connecting the battery state notifying unit 940 and the battery state monitoring 960, and to facilitate wiring design and wiring work for the wiring harness 970. Furthermore, transmission of the aforementioned battery state data composed of the digital signal to the battery state monitoring unit 960 makes it possible to reduce the signal to be transmitted to lower voltage of the order of several volts, facilitating electrical design for safety/reliability such as insulation resistance or noise resistance to the battery state monitoring unit 960.

CITATION LIST

Patent Literature

[PTL 1]
Japanese Patent Application Laid-Open Publication No. 2011-76936

SUMMARY

Disadvantageously, since the battery state notifying unit 940 disposed to the battery pack 910 is designed to comply with the number of battery cells 921 composing the battery module 920 of the battery pack 910, the battery state notifying unit 940 cannot be commonly used among the battery packs in which the battery cells differ in the number thereof from each other as the battery packs 910 may differ in the number thereof from each other, making it difficult to share the battery state notifying unit 940, which disturbs reduction of manufacturing cost.

The object of the invention is to resolve the concerned problems. Namely, the object of the invention is to provide a battery state notifying unit readily exchangeable among the battery packs in which the battery cells differ in the number thereof from each other, a bus bar module and a battery pack including the battery state notifying unit, and a battery state monitoring system including the battery state notifying unit.

The invention of one aspect, in order to achieve the above object, relates to a battery state notifying unit that is disposed to a battery pack including a plurality of battery cells given by multiplying predetermined units S by more than one integer n, and a plurality of battery state outputting devices outputting an analog signal in accordance with a state of the battery cell, and is connected to a battery state monitoring unit monitoring a state of the battery pack, the battery state notifying unit including: a plurality of subunits (i.e., the number, n) corresponding to every battery cell of the predetermined units S, the subunits including a data generator generating a battery state data including a digital signal having a data indicating the state of the battery cell corresponding to the subunits in accordance with the analog signal outputted from the battery state outputting device, a data transmitter transmitting the battery state data generated by the data generator to the battery state monitoring unit.

Preferably, the subunit further includes a data relaying device relaying the battery state data transmitted by other subunit.

Preferably, the data relaying device includes a first connector, a second connector engageable with the first connector of other subunit, and a transmitter transmitting the battery state data between the first connector and the second connector.

The invention of the other aspect relates to a bus bar module disposed to a plurality of battery cells given by multiplying a predetermined units by a more than one integer, the bus bar module including: a plurality of battery state outputting devices outputting an analog signal in accordance with a state of the battery cell, and the battery state notifying unit.

The invention of the other aspect relates to a battery pack including a plurality of battery cells given by multiplying a predetermined units by a more than one integer, and a plurality of battery state outputting devices outputting an analog signal in accordance with a state of the battery cell, the battery pack comprising the battery state notifying unit.

The invention of the other aspect relates to a battery state monitoring system one or a plurality of battery pack including a plurality of battery cells given by multiplying a predetermined units by a more than one integer, and a plurality of battery state outputting devices outputting an analog signal in accordance with a state of the battery cell, and a single battery state monitoring unit monitoring a state of the battery pack, the battery pack being provided with the battery state notifying unit.

Advantageous Effects

According to the invention, since the plurality of subunits corresponding to every battery cell of the predetermined units is provided, the subunits generates the battery state data including a digital signal having data indicating the state of the battery cell corresponding to the subunits in accordance with the analog signal outputted from the battery state outputting device, and the battery state data is transmitted to the external battery state monitoring unit, increase or decrease of the subunits according to the number of the battery cells the battery pack includes makes it possible to commonly use among the battery packs in which the battery cells differ in the number thereof from each other, and thereby to share the battery state notifying unit by altering the number of the subunits the battery notifying unit include in compliance with the number of the battery cells of the battery pack, reducing manufacturing cost.

According to the invention, since the subunit further includes the data relaying device relaying the battery state data transmitted by the other subunit, serial connection of the plurality of subunits with each other makes it possible to integrate through each subunit the battery state data transmitted by each subunit to a single subunit arranged at end, and the single subunit may therefore only be connected to the external battery state monitoring unit, which facilitates connection to the external and thus improves workability of assembling the devices or the system into which the battery state notifying unit is incorporated.

According to the invention, since the relaying device includes the first connector, and the second connector adapted to be engaged with the first connector, the transmission part transmitting the battery state data between the first connector and the second connector, engagement of the first and the second connectors among the subunits enables the subunits to connect in series with each other, eliminating wiring harness connecting the subunits to each other, which improves workability of assembling the battery state notifying unit.

According to the invention, since the battery state notifying unit is provided, increase or decrease of the subunits according to the number of the battery cells the battery pack includes makes it possible to commonly use among the battery packs in which the battery cells differ in the number thereof from each other, and thereby to share the battery state notifying unit by altering the number of the subunits the battery notifying unit include in compliance with the number of the battery cells of the battery pack, reducing manufacturing cost.

BRIEF DESCRIPTION OF DRAWINGS

FIG. 6A is a functional block chart illustrating the subunit in FIG. 5;

FIG. 6B is a view illustrating a modified example of a connection between a terminal leg and a cell voltage input in the subunit in FIG. 6A;

FIG. 7 is a flow chart illustrating one example of a process of a battery cell voltage detection a microprocessor (CPU) in the sub set in FIG. 6A executes;

FIG. 8 is a flow chart illustrating one example of a process of a battery cell temperature detection the microprocessor (CPU) in the sub set in FIG. 6A executes;

Figure 1:
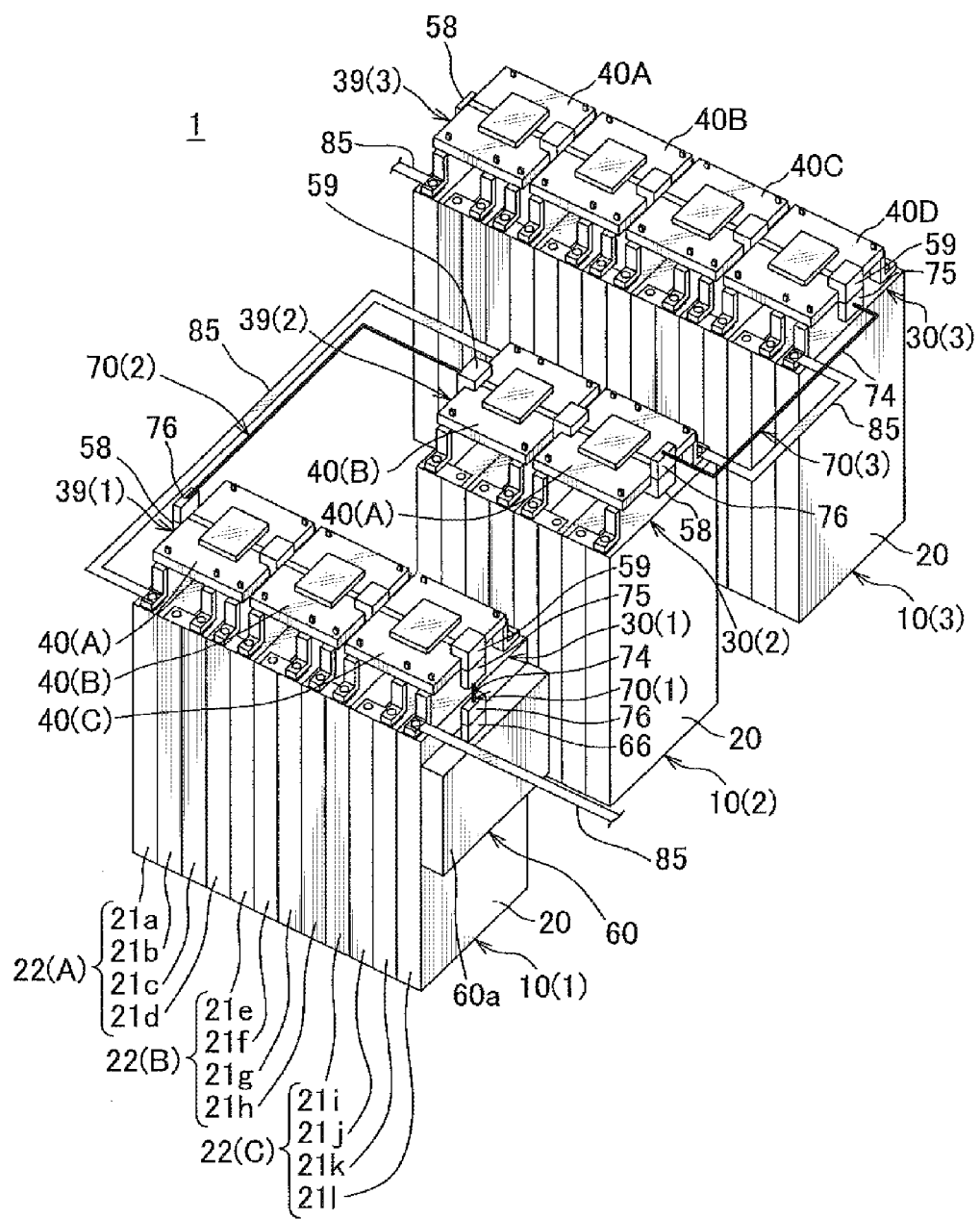
FIG. 1 is a perspective view illustrating a battery power system that is one embodiment of a battery state monitoring system of the invention.

REFERENCE SIGNS LIST 1 battery power source system (battery state monitoring unit)
10 battery pack
20 battery module
21 battery cell
21c positive electrode
21d negative electrode
22 battery set
30 bus bar module
31 case
32 bus bar (battery state outputting device)
33 terminal fitting (battery state outputting device)
34 temperature sensor (battery state outputting device)
36 lead line
39 battery state notifying unit
40 subunit
42 unit board
43 terminal leg
45 cell voltage input part
47 first ADC
48 second ADC
50 microprocessor
51 CPU (data generator)
55 communication module (data transmitter)
58 first connector (data relay device)
59 second connector (data rely device)
60 battery state monitoring module
70 wiring harness
71 power source line
72 common signal line
73 ground line
423 relay wired pattern (transmitter part, data relay device)
S a number of predetermined units
V1 to V4 between electrodes voltage
T1 temperature storing area

DETAILED DESCRIPTION OF EXEMPLARY EMBODIMENTS

Hereinafter, with reference to FIGS. 1 to 15 a battery power system is discussed that is one embodiment of a battery state monitoring system of the invention.

The battery power system of the present invention is what is mounted in a hybrid vehicle, and supplies power with an electric motor. This battery power system is provided with a battery pack composing a high-voltage power source for driving the aforementioned electric motor. The hybrid vehicle is also provided with a low-voltage battery other than the battery pack, which composes a low-voltage power source of the order of 12 V for initiating an engine or for activating electric components in a car room.

Figure 2:
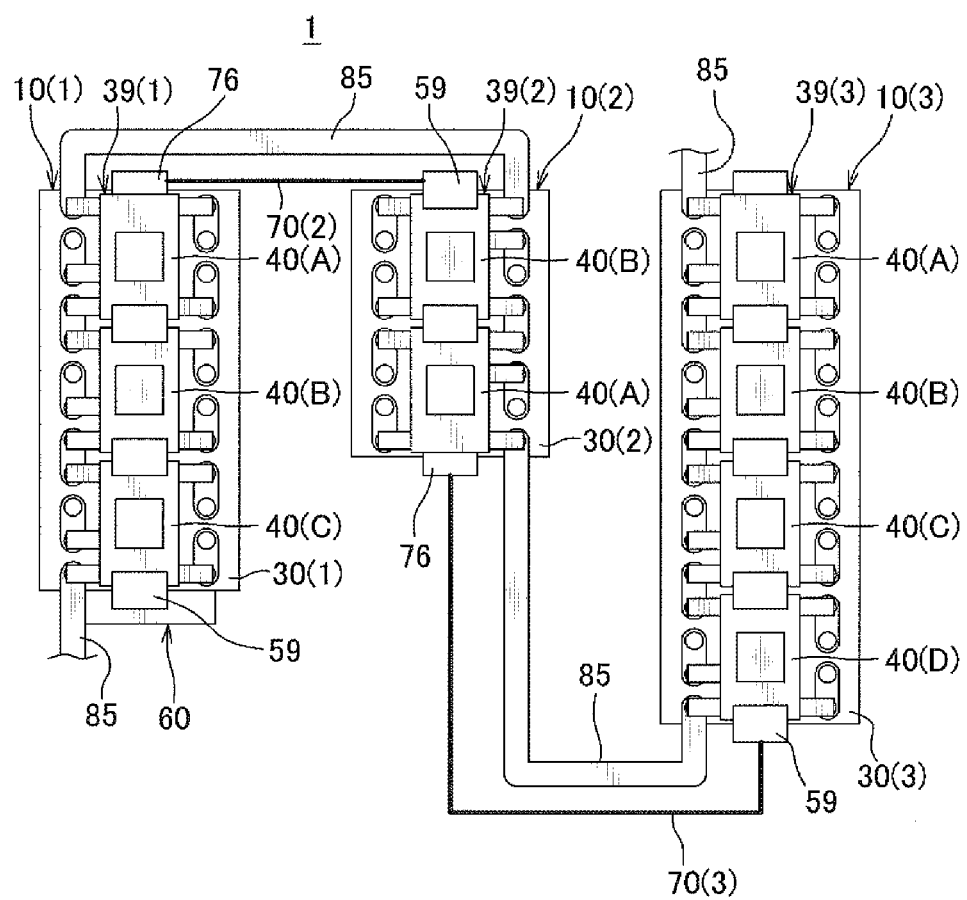
FIG. 2 is a top view illustrating the battery power system in FIG. 1.
Figure 3:
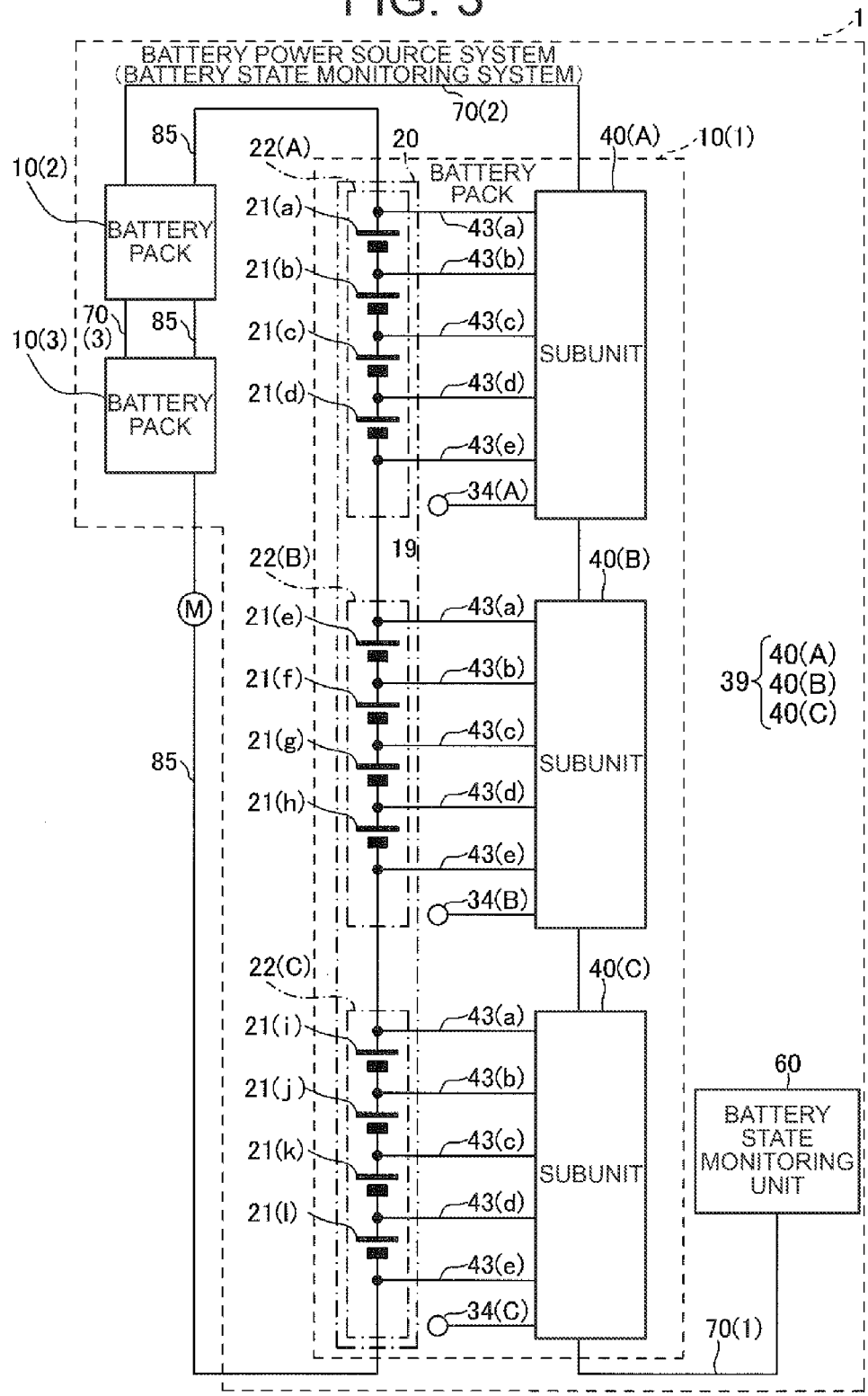
FIG. 3 is a functional block chart illustrating the battery power system in FIG. 1.

As shown in FIGS. 1 to 3, the battery power system (shown by reference sign 1) is provided with a battery pack 10 as a plurality of battery pack, a battery state monitoring unit 60 monitoring a state of the battery pack 10, and a plurality of wiring harnesses 70 connecting the plurality of battery packs 10 and the battery state monitoring unit 60.

The plurality of battery packs 10 is connected by a power source cable 85 capable of applying large current in such a way as to be in series and to compose closed loop along with an electric motor M. In the present embodiment, the battery pack is provided in three (battery packs 10 (1) to (3)). Hereinafter, each component will be provided with (1) to (3) to end of its reference sign when specifying component of each of the battery packs 10 (1) to (3).

Figure 4:
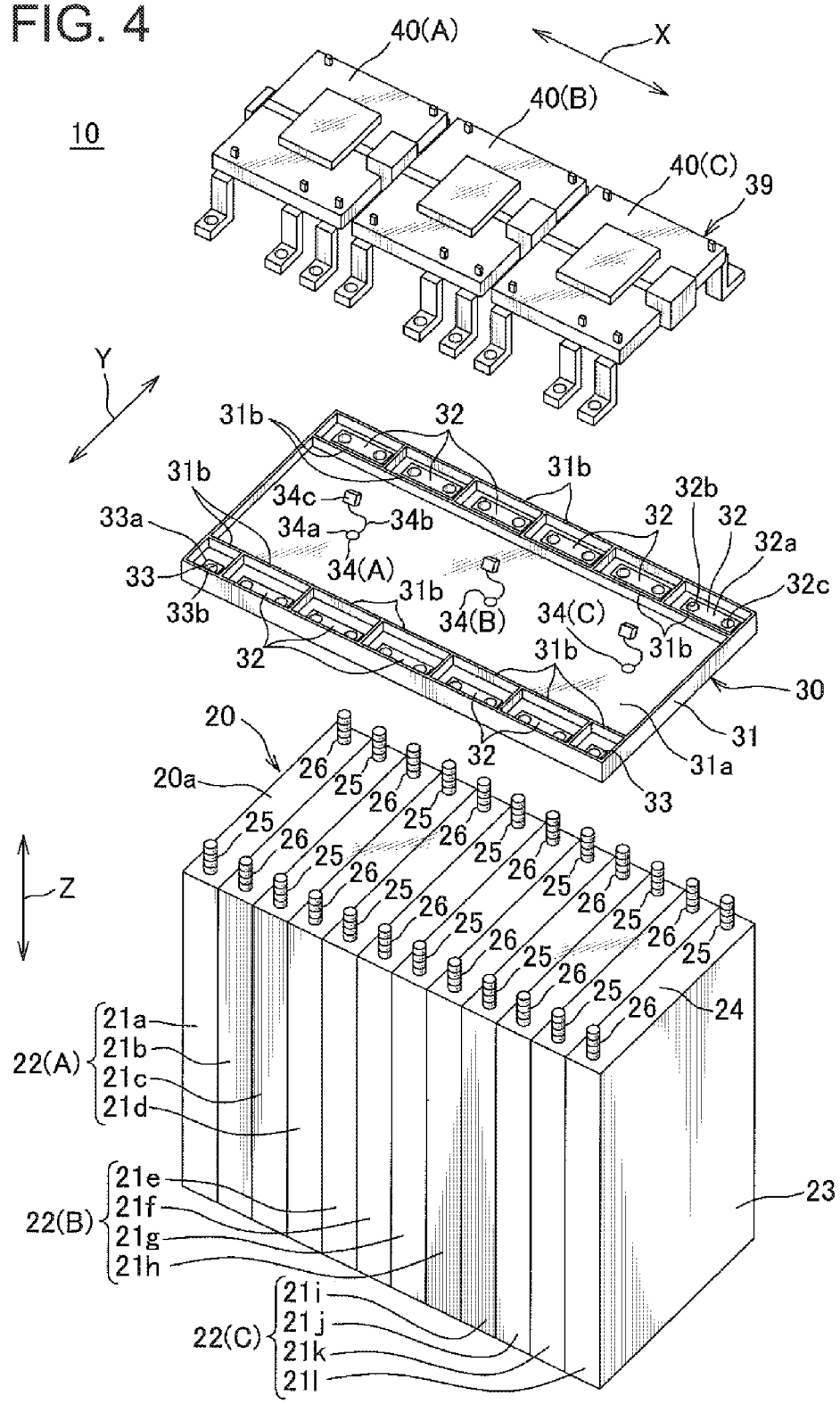
FIG. 4 is an exploded perspective view illustrating a battery pack including the battery power system in FIG. 1.

The battery packs 10 is provided with a battery module 20 and a bus bar module 30 as shown in FIG. 4. FIG. 4 illustrates the battery pack 10(1) as a typical example, but the other battery packs 10(2), 10(3) are likewise configured.

The battery module 20 is provided with a plurality of battery cells 21 arranged in line in one direction (the arrow X direction in FIG. 4) and fixed to each other. The number of battery cells 21 is set by multiplying a number of predetermined units S by more than one integer n. An assembly of the battery cells 21 of the number of the predetermined units S is defined as one battery set 22.

In the present embodiment, the predetermined number of the units S is set to four, and the plurality of battery cells 21 in the battery pack 10(1) is set to 12 (battery cells 21(a) to (l)) that is triplication of the predetermined number of units S. These plurality of battery cells 21, the battery cells 21(a) to (d) composes the battery set 22(A), the battery cells 21(e) to (h) the battery set 22(B), the battery cells 21(i) to (l) the battery set 22(C). Hereafter, each component will be provided with (A) to (C) to end of its reference sign when specifying component of each of the battery sets 10(A) to (C).

Furthermore, the battery cell 21 in the battery pack 10(2) is set to eight that is double of the predetermined number of units S, the battery cell 21 in the battery pack 10(3) is set to 16 that is quadruple of the predetermined number of units S. In these battery packs 10(2), (3), the battery cell 21 of the predetermined number of units S composes the battery set 22 as is the case with the battery pack 10(1).

The mentioned above illustrate one example, but as far as not contrary to the object of the invention, such the number of the battery packs 10, the number of battery cells 21 in each battery pack 10, or the predetermined number of units S is optional.

Each battery cell 21 is provided with a rectangular battery body 23, and a pair of columnar positive electrode 25 and negative electrode 26 projecting from each of one end and the other end of one face 24 of this battery body 23. The positive electrode 25 and the negative electrode 26 have outer peripheral faces thereof threaded. The positive electrode 25 and the negative electrode 26 have not-shown nuts screwed, which secures bus bar 32 and a terminal fitting 33 to be mentioned below to the positive electrode 25 and the negative electrode 26.

The plurality of battery cells 21 has the aforementioned one face 24 of the battery body 23 arranged in the same direction (upward direction in FIG. 4) so that the battery bodies 23 of the adjacent battery cells 21 are arranged to be in contact with each other. The plurality of battery cells 21 is arranged in such a manner that one of the positive electrode 25 of the battery cell 21 and the negative electrode 26 of the other battery cell 21 adjacent to the one of the battery cell 21 are alternately adjoined (namely, subsequently arranged are along the arrow X direction the positive electrode 25, the negative electrode 26, the positive electrode 25, the negative electrode 26 . . . ) The plurality of battery cells 21 is fixed to each other by not-shown binder with the arrangement mentioned above being kept. The battery module 20 is formed in a general cuboid shape such that the plurality of battery cells 21 are continued.

The bus bar module 30 is provided with a case 31, a plurality of bus bars 32, a plurality of terminal fittings 33, a plurality of temperature sensors 34, and a battery state notifying unit 39.

The case 31 is generally plate like-shaped, made of insulating synthetic resin. The case 31 has its planar view form rectangular-shaped generally the same as that of a face of the battery module 20 (hereafter referred to as "electrode face 20a") that is formed such that the aforementioned one faces 24 of each battery cell 21 continue. The other face of the case 31 (hereafter referred to as "upper face 31a") is provided with a plurality of boxes 31b open upward for housing a plurality of bus bars 32 and a plurality of terminal fittings 33 to be mentioned below that are arranged in two lines in a longitudinal direction 31 of the case 31 (the X direction).

The case 31 is attached to the battery module 20 such that the other face opposite to the upper face 31a is closely overlaid onto the electrode face 20a of the battery module 20. At this time bottom faces of the plurality of boxes 31b include insertion holes corresponding to the positive electrode 25 and the negative electrode 26 such that the positive electrode 25 and the negative electrode 26 of the aforementioned electrode face 20a project inside the boxes 31b. Note that in FIGS. 1, 2, and 13, the description is omitted of the case 31 for illustrative convenience.

The plurality of bus bars 32 is each provided with a bus bar body 32a made of generally rectangular-shaped conductor, and both ends of the bus bar body 32a are provided with a pair of bus bar insertion holes 32b, 32c. In this embodiment, the plurality of bus bars 32 is provided in the number corresponding to that of the battery cell 2 of the battery module 20 (namely, "the number of battery cell 21"−1). In the configuration shown in FIG. 4 the bus bars 32 numbers in eleven. The bus bar 32 is, when housed in the box 31b, formed such that the pair of bus bar insertion holes 32b, 32c are overlaid onto the insertion holes in the bottom of the box 31b. The pair of bus bars 32b, 32c has the positive electrode 25 and the negative electrode 26 of the battery cells adjacent to each other pass therethrough, and thereby the bus bar 32 connects in series these battery cells 21.

The plurality of terminal fittings 33 includes a fitting body 33a made of generally square-shaped conductive metal plate, at middle of which a metal fitting insertion hole 33b is provided. In the present embodiment, the plurality of terminal fittings 33 numbers in two. The one of terminal fitting 33 is arranged in the box 31b disposed at one end of the other of the case 31 (leftward in FIG. 4) such that the positive electrode 25 of the battery cell 21(a) arranged at one end of the battery module 20 is inserted into the fitting insertion hole 33b. The other of the terminal fitting 33 is arranged in the box 31b disposed at the other end of the case 31 (rightward in FIG. 4).

The plurality of bus bars 32 and the plurality of terminal fittings 33 are connected to battery state notifying unit 39 to be described later. The bus bar 32 and the terminal fitting 33 corresponds to a battery state outputting device in the claims. A voltage of the positive electrode 25 and the negative electrode 26 of the battery cell 21 (between-electrodes voltage) corresponds to an analog signal in the claims, which is observed (i.e., outputted) through the bus bar 32 and the terminal fitting 33.

The plurality of temperature sensors 34 is each provided with a temperature sensing element 34a such as thermistor element, and a connector 34c connected to the temperature sensing element 34a via a lead wire 34b, a voltage corresponding to the temperature measured by the temperature sensing element 34a is configured to output to the connector 34c. In the present embodiment, the plurality of temperature sensors 34 is provided as many as battery sets 22 corresponding to each battery set 22 in the battery module 20. The configuration illustrated in FIG. 4 has each one at both ends and one at a middle of the case in its longitudinal direction disposed, total three (temperature sensors 34(A) to (C)).

These temperature sensors 34(A) to (C) are each arranged on the battery cells 21(c), (g), (k) included in these battery sets 22(A) to (C) so as to correspond to battery sets 22(A) to (C). The temperature sensing element 34a of each temperature sensor 34 is arranged press-fitted in the insertion hole disposed to the case 31, conforming to the shape of the temperature sensing element 34a so as to contact with the electrode face 20a of the battery module 20, and outputs a voltage corresponding to the temperature of the electrode face 20a (namely, the battery cells 21(c), (g), (k)). The plurality of temperature sensor 34 is connected to the battery state notifying unit 3 to be mentioned later. The sensor 34 corresponds to a battery state outputting device in the claims. The voltage the temperature sensor 34 also corresponds to the analog signal in the claims. Note that in order to correspond to all the battery cells 21(a) to (l), the temperature sensor 34 may be disposed twelve.

The battery state notifying unit 39 includes a plurality of subunits connected in series to each other, and arranged on the upper face 31a of the case 31. In the present embodiment, the subunits 40 numbers in as many as the battery sets 22, corresponding to every battery set 22 in the battery module 20. In the configuration shown in FIG. 4 the battery state notifying unit 39(1) is configured so that three subunits 40 (subunits 40(A) to (C)) are connected in series. Likewise, the battery state notifying unit 39(2) is configured so that two subunits 40(subunits 40(A), (B)) are connected in series, the battery state notifying unit 39(3) is configured so that four subunits 40(subunits 40(A) to (D)) are connected in series.

Figure 5A:
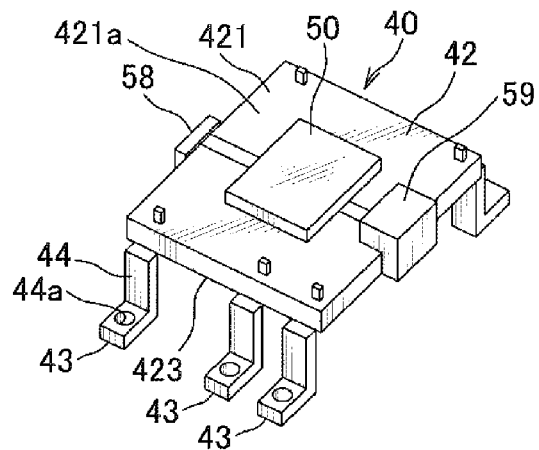
FIG. 5A is a perspective view illustrating a subunit of a battery state notifying unit the battery pack in FIG. 4 includes.
Figure 5B:
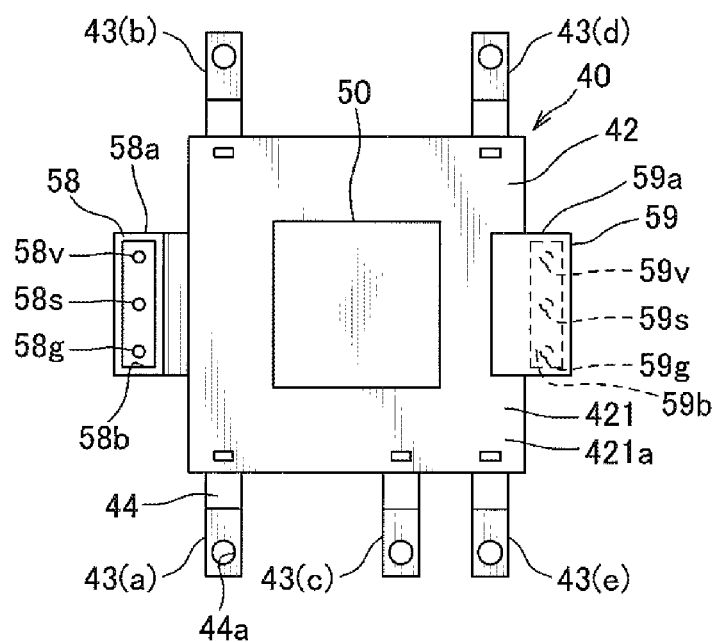
FIG. 5B is a top view illustrating the subunit in FIG. 5A.
Figure 5C:
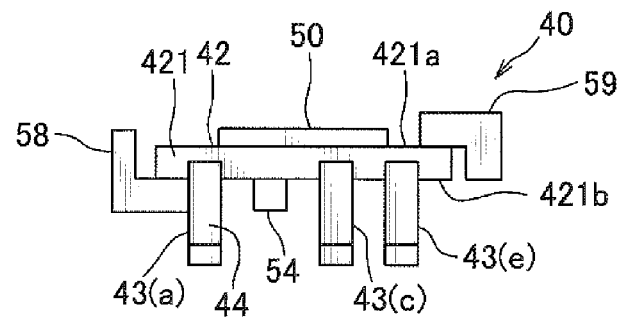
FIG. 5C is a side view illustrating the subunit in FIG. 5A.

The subunit 40 include a unit board 42 as shown in FIG. 5(a) to (c).

The unit board 42 is each composed of electric component such as microcomputer 50 (hereinafter referred to as "⌈XOM☐") being mounted onto the board 421 composed of a known rectangular printed circuit board (PCB) where wired patterns are disposed. Note that in FIG. 5 ⌈XOM 50 is mounted to one face of the board 421 (hereinafter referred to as "upper face 421a"), and electric components except the ⌈XOM 50 are omitted for their descriptions. The unit board 42 is provided with a temperature sensor connector 54, a first connector 58, a second connector 59, and a plurality of terminal legs 43.

The temperature sensor connecting connector 54 is a known connector of board mount type, and is mounted to the other face (hereinafter referred to as "lower face 421b") opposed to the upper face 421a of the board 421. The temperature sensor connecting connector 54, by being connected to the connector 34c of the aforementioned temperature sensor 34, has the temperature sensor 34 connected to the subunit 40. The temperature sensor connecting connector 54 is connected to a second ADC 48 to be mentioned later via the wired patterns.

The first connector 58 is a connector of female type that includes a generally prism-shaped housing 58a bent into L-shape, female terminal fittings 58v, 58g, 58s housed in the housing 58a. The housing 58a has an engaging opening 58b disposed at a tip thereof. The first connector 58 has a base end of the housing 58a attached to one edge in the lower face 421b of the board 421, and has the engaging opening 58b of the tip of the housing 58a arranged toward the upper face 421a of the board 421.

The second connector 59 is a connector of male type that includes a generally prism-shaped housing 59a bent into L-shape, male terminal fittings 59v, 59g, 59s housed in the housing 59a. The housing 59a has an engaging opening 59b disposed at a tip thereof. The second connector 59 has a base end of the housing 59a attached to the other edge opposed to the aforementioned one edge in the upper face 421a of the board 421, and has the engaging opening 59b of the tip of the housing 59a arranged toward the lower face 421b of the board 421.

The female-type terminal fitting 58v and the male-type terminal fitting 59v are connected to a power source wired pattern on the board 421 (i.e., a power source voltage Vcc (FIG. 6)). The female-type terminal fitting 58g and the male-type terminal fitting 59g are connected to a ground wired pattern on the board 421 (i.e., a ground GND (FIG. 6)). The female-type terminal fitting 58s and the male-type terminal fitting 59s are connected to each other via a relay wired pattern 423 on the board 421 (FIG. 6). The relay wired pattern 423 is connected to a communication module 55 to be mentioned later. This relay wired pattern 423 corresponds to a transmitting part, and composes data relaying device in the claims along with the first connector 58, the second connector 59, and the relay wired pattern 423.

The first connector 58 and the second connector 59 are adapted to be engageable with each other. When the first connector 58 and the second connector 59 are engaged, the female-type terminal fitting 58v and the male-type terminal fitting 59v, the female-type terminal fitting 58g and the male-type terminal fitting 59g, the female-type terminal fitting 58s and the male-type terminal fitting 59s contact with each other. This makes the power source wired pattern, the ground wired pattern and the relay wired pattern 423 between one subunit 40 and the other subunit 40 electrically connect to each other upon engaging and connecting the first connector 58 of the other subunit 40 to the second connector 59 of the one subunit 40 to each other.

In the present embodiment, the first connector 58 of the subunit 40(B) is connected to the second connector 59 of the subunit 40(A), the first connector 58 of the subunit 40(C) the second connector 59 of the subunit 40(B), and each subunit 40(A) to (C) is connected in series to each other, completing the battery state notifying unit 39(1). The battery state notifying units 39(2), (3) are completed in the same manner.

Then, the first connector 58 of the subunit 40(A) of the battery state notifying unit 39(1) and the second connector 59 of the subunit 40(B) of the battery state notifying unit 39(2) are connected with a wiring harness 70(2) mentioned later, and the first connector 58 of the subunit 40(A) of the battery state notifying unit 39(2) and the second connector 59 of the subunit 40(D) of the battery state notifying unit 39(3) are connected with a wiring harness 70(3) mentioned later.

This makes the power source wired pattern and the ground wired pattern of each subunit 40 of the battery state notifying unit 39(1) to (3) electrically connected through a power source line 71 and a ground line 73 of the wiring harness 70, and a single signal line (bus signal line) is configured logically each bus-connecting the bus subunits 40 by the relay wired pattern 423 and the common signal line 72 of the wiring harness 70.

Then, when the second connector of the subunit 40(C) of the battery state notifying unit 39(1) and the connector 66 of the battery state monitoring unit 60 are connected through a wiring harness 70(1) mentioned later, the aforementioned low-voltage power is applied from the battery state monitoring unit 60 through the power source line 71 and the ground line 73 of the wiring harness 70(1) onto the power source wired pattern and the ground wired pattern of each subunit 40, and each subunit 40 operates with the lower-voltage power source. The common signal line 72 of each wiring harness 70 and the relay wired pattern 423 of each subunit 40 allow the battery state monitoring unit 60 and each subunit 40 to be bus-connected.

The terminal leg 43, as shown in FIG. 5, includes a generally L-shaped fitting body 44 made as by conductive metal plate being punched into a strip-like shape and a middle thereof in a longitudinal direction being bent orthogonally. The fitting body 44 has a leg insertion hole 44a passing therethough the positive electrode 25 or the negative electrode 26 of the aforementioned battery cell 21 disposed at one end thereof. Furthermore, the fitting body 44 has the other end thereof passed through the board 421 from the lower face 421b and fixed to the board 421 by soldering. The terminal leg 43 is connected to the cell voltage input part 45 mentioned later through such wired pattern.

The plurality of terminal legs 43 is each provided with a pair of edges orthogonal to edges disposed to the first connector 58 and the second connector 59 in the board 421. In the present embodiment, of the pair of edges one has three pieces (terminal legs 43(a), (c), (e)), the other two pieces (terminal legs 43(b), (d)). The leg insertion holes 44a of the plurality of terminal legs 43 are arranged overlaid on the bus bar insertion holes 32b, 32c, or the terminal insertion hole 33b of the terminal fitting 33. Then, the positive electrode 25 and the negative electrode 26 of the battery cell 21 are passed through each insertion hole, not-shown nut is threaded into each electrode, and thus each terminal leg 43 is pinched with the bus bar 32 or the terminal fitting 33 to be fixed. Each terminal leg 43 is electrically connected to the bus bar 32 or the terminal fitting 33 (namely, the positive electrode 25 and the negative electrode 26 of each battery cell 21).

FIG. 6A illustrates function block for the subunit 40. While the FIG. 6(A) illustrates as one example the subunit 40(A) disposed corresponding to the battery set 22(A), the other subunits 40(B), (C) have the same configurations as the subunit 40(A).

The subunit 40(A) has the temperature sensor connecting connector 54 aforementioned, the first connector 58, the second connector 59, the plurality of terminal legs 43(a) to (e), and in addition to these a cell voltage input 45, a first ADC 47, a second ADC 48, the μCOM 50, and the communication module 55 disposed to the board 421. Note that the cell voltage input part 45, the first ADC 45, the second ADC 48, the μCOM 50, and the communication module 55 may be each provided as a separate component, or may be housed into a single IC package.

The cell voltage input part 45 is provided with a single output terminal PO, a switching control terminal C, a known multiplexer (not shown) outputting from output terminal PO a signal in accordance with a voltage inputted into the input terminals PI1 to PI5 according to the connection switching signal 1 inputted into the switching control terminal C.

Furthermore, in the cell voltage input part 45 the battery module 20 (namely, the plurality of battery cells 21) outputting between-electrodes voltage (namely, the high-voltage analog signal) of the order of several volts in accordance with a remaining amount of the battery cell 21 is connected to each input terminal PI, and, on the other hand, the first ADC 47 operable in a low-voltage in the order of several volts is connected to the output terminal PO. Therefore, a known flying-capacitance circuit (not shown, refer to the Japanese Patent Application Laid-Open Publication No. HE11-248755, or Japanese Patent Application Laid-Open Publication No. 2006-337130 for example) is furthermore provided which separates these high-voltage components (namely, the high-voltage power source mentioned above) and the low-voltage components (namely, the low-voltage power source mentioned above), and converts a high-voltage analog signal to a low-voltage analog signal operable to enter into the first ADC 47.

The input terminal PI1 of the cell voltage input part 45 has the terminal leg 43(a) connected thereto through a current limiting resistance R1. Namely, the input terminal PI1 has the positive electrode 25 of the battery cell 21(a) connected thereto. The input terminal PI2 also has the terminal leg 43(b) connected thereto through a current limiting resistance R2. Namely, the input terminal PI2 has the positive electrode 26 of the battery cell 21(a) and the positive electrode 25 of the battery cell 21(b) connected thereto. Hereinafter, in the same manner, the input terminals P13, PI4 have respectively the negative electrodes 26 of the battery cells 21(b), (c) and the positive electrodes 25 of the battery cells 21(c), (d) connected thereto through the current limiting resistances R3, R4. The input terminal P15 also has the negative electrode 26 of the battery cell 21(d) connected thereto through a current limiting resistance R5.

Namely, the cell voltage input part 45 has the between-electrodes voltage between the positive electrode 25 and the negative electrode 26 of the battery cell 21(a) input to between the input terminal P11 and the input terminal P12. Likewise, the between-electrodes voltage of the battery cell 21(b) is inputted to between the input terminal PI2 and the input terminal P13, and hereinafter in the same manner, the between-electrodes voltages of the battery cell 21(c), (d) are inputted to between the input terminal P13 to P15. Then, the cell voltage input part 45 converts the between-electrodes voltages of the battery cell 21 inputted into these input terminals PI to "cell voltage signals" that are analog signals of low-voltage by the flying-capacitance circuit, and outputs from the output terminal PO the cell voltage signal aforementioned according to the battery cell 21 directed by the connection switching control signal 1 initiated from the μCOM 50.

Furthermore, the input terminals P11 to P15 of the cell voltage input part 45 each have discharging switches SW1 to Sw4 connected thereto that shunt the adjacent input terminals PI to each other. Specifically, the discharging switch SW1 is disposed between the input terminal P11 and the input terminal P12, the discharging switch SW2 between the input terminal P12 and the input terminal P13, and, hereinafter, in the same manner, the discharging switches SW3, SW4 between input terminals P13, P14, between input terminals P14, P15, respectively.

The discharging switches SW1 to SW4 are controlled by the μCOM to switch separately. For example, closure of the discharging switch SW1 composes a closed circuit in order of the positive electrode 25 of the battery cell 21(a), the negative electrode 26 of the battery cell 21(a), and discharges the battery cell 21(a). This makes between-electrodes voltage of the battery cell 21(a) reduce. The other discharging switches SW1 to SW4 correspond to the battery cells 21(b) to (d), in the same manner as the above, disclosures of the discharging switches SW2 to SW4 makes the battery cells 21(b) to (d) discharge and thus leads to reduction of between-electrodes voltages. The discharging switches SW1 to SW4 normally open, but are closed only when the battery cell 21 is required to discharge.

The aforementioned embodiment, as shown in FIG. 6A, is configured to connect terminal legs 43(a) to (e) to each of the input terminals PI1 to PI5 via the current limiting resistances R1 to R5, but is not limited to this configuration. Other than such configuration, for example, as shown in FIG. 6B in part, the terminal legs 43(a), (b) may be directly connected to the input terminals PI1, PI2 of the cell voltage input part 45, and the discharging switch SW1 and the current limiting resistance R1 connected in series to the discharging switch SW1 may be disposed between the input terminal PI1 and the input terminal PI2 as well. Likewise, the other input terminals PI3 to PI5 may be directly connected to the terminal legs 43(a) to (e), and the current limiting resistance R2 to R4 connected in series to the discharging switch SW2 to SW4 may be disposed between the input terminals PI as well. This is accompanied by reduction of the current limiting resistance by one. Furthermore, direct connection of each terminal leg 43 and each input terminal PI eliminates voltage reduction by the current limiting resistance, improving accuracy for detection of the between-electrodes voltage of the battery cell 21, especially, even in the case of closure of the discharging switch SW (namely, during discharge of the battery cell) enabling accurately detecting between-electrodes voltage.

The first ADC 47 is a known analog-digital conversion circuit. The input part of the first ADC 47 is connected with the output terminal PO of the cell voltage input part 45, an output of the first ADC 47 the μCOM 50. The first ADC 47, when the cell voltage signal outputted from the cell voltage input part 45 is inputted, quantizes and converts the cell voltage signal to digital data, and outputs the digitized cell voltage signal to the μCOM 50.

The second ADC 48 is a known analog-digital conversion circuit like the first ADC 47. An input of the first ADC 48 is connected with the temperature sensor connecting connector 54, an output of the first ADC 48 the μCOM 50. The second ADC 48, when a voltage (namely, an analog signal) outputted from the temperature sensor 34(A) is inputted through the temperature sensor connecting connector 54 as a "cell temperature signal," quantizes and converts the cell temperature signal to digital data, and outputs the digitized cell temperature signal to the the μCOM 50.

The microprocessor 50 includes a central processing unit (CPU) executing various processes or controls according to preliminarily defined program, a read-only memory (ROM) in which processing programs or various datum for the CPU 51 are stored, a random access memory RAM 53 storing various datum and including a memory required for process work of the CPU 51, and a not-shown external interface. The ROM 52 has processing program stored therein that works the CPU 51 as various means such as data generating means. The CPU 51 functions as the various means aforementioned by executing processing programs.

The external interface has the first ADC 47 and the second ADC 48 connected thereto. The external interface sends the cell voltage signal and the cell temperature signal respectively inputted from the first ADC 47 and the second ADC 48 to the CPU 51. The external interface also has the communication module 55 connected thereto.

The communication module 55 is configured operable to communicate using LIN (Local Interconnect Network) protocol that is a known serial multi communication protocol. The communication module 55 is located between the μCOM 50 and the relay wired pattern 423. The communication module 55 is connected with the relay wired pattern 423, a relay wired pattern 423 for other subunit 40 via the female-type terminal fitting 58a and the male-type terminal fitting 59s, and the common signal line 72 of the wiring harness 70. Namely, the communication module 55 is bus-connected to a logically-single signal line (bus signal line) composed of the relay wired pattern 423 of each subunit 40 and common signal line 72 of the wiring harness 70.

The communication module 55 communicates on LIN between battery state monitoring units mentioned later connected likewise to the common signal line 72 using the relay wired pattern 423 and the common signal line 72. The communication module 55 outputs various datum such as command sent from the battery state monitoring unit 60 via the relay wired pattern 423 and the common signal line 72 to the μCOM 50, and outputs various datum such as battery state data sent from the μCOM 50 to the battery state monitoring unit 60 via the relay wired pattern 423 and the common signal line 72. The communication module 55 corresponds to data transmitting device in the claims.

Figure 9:
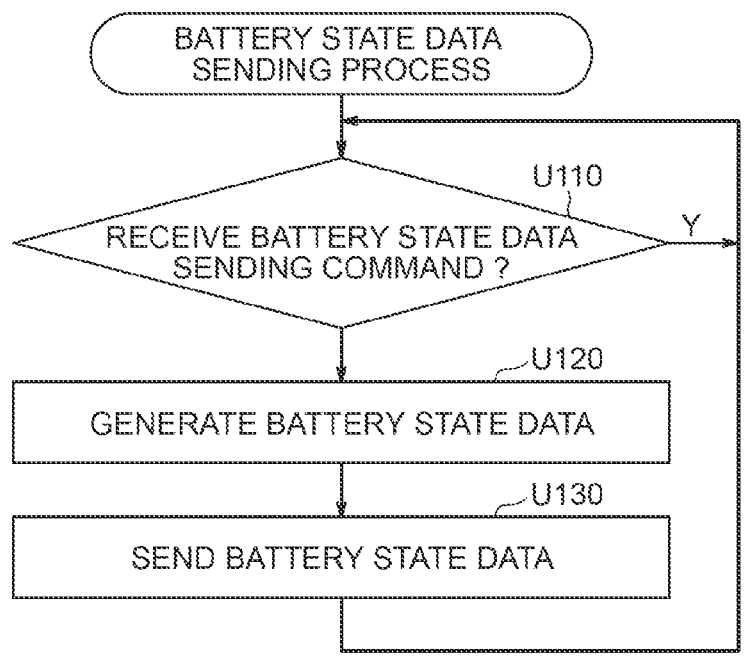
FIG. 9 is a flow chart illustrating one example of a process of a battery state data transmission the microprocessor (CPU) in the sub set in FIG. 6A executes.
Figure 10:
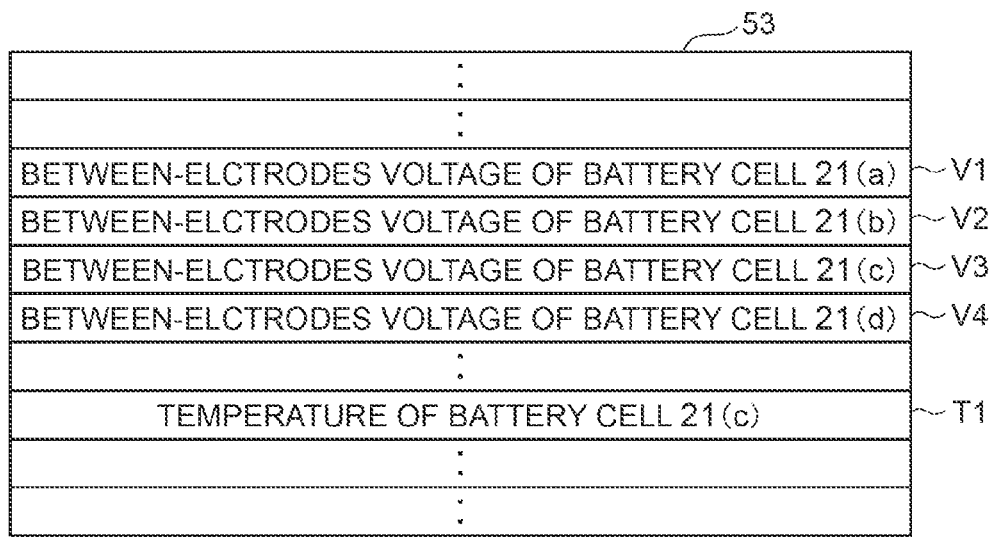
FIG. 10 is an illustrative chart of storing areas for a between-electrodes voltages and for temperature disposed to RAM of a microprocessor (CPU) in the battery state notifying unit in FIG. 6A.

Then, with reference to FIGS. 7 to 9 one exemplified operation related to the present invention of the aforementioned subunit 40(A) is discussed. Note that for the other subunits 40, the similar operation is performed.

In the subunit 40(A) (namely, CPU 51 of the μCOM 50), a battery cell voltage detecting process (FIG. 7), a battery cell temperature detecting process (FIG. 8), and a battery state data sending process (FIG. 9) are executed in parallel.

The CPU 51 executes the battery detecting process (FIG. 7) at a predetermined intervals.

The CPU 51 firstly switches a connection of the cell voltage input part 45 so that the cell voltage signal is outputted to the first ADC 47 according to the between-electrodes voltage of the first battery cell 21(a) (S110).

Specifically, the CPU 51 converts the between-electrodes voltage of the battery cell 21(a) inputted to the input terminals PI1, PI2 of the cell voltage input part 45 to the cell voltage signal by the flying-capacitance circuit, and sends connection switch controlling signal 1 to the cell voltage input part 45 so as to output from the output terminal PO the aforementioned cell voltage signal according to the battery cell input 21(a). This makes the cell voltage signal corresponding to the battery cell 21(a) input to the first ADC 47. Then, in the first ADC 47, the cell voltage signal is quantized and converted to digital data, and the digitized cell voltage signal is inputted to the CPU 51 via the external interface.

Then, the CPU 51 detects the between-electrodes voltage of the battery cell 21(a) based on the cell voltage signal inputted from the first ADC 47 (S120). The detected between-electrodes voltage of the battery cell 21(a) is subsequently stored into an area V1 corresponding to the battery cell 21(a) of between-electrode voltage storing areas V1 to V4 (show in FIG. 10) disposed on the RAM 53 every battery cell 21 in the plural (S130).

Hereinafter, the CPU 51, until detecting the between-electrodes voltage for the forth battery cell 21(d) that is the last battery (N in S140), in the same manner as the above, serially switches connection of the cell voltage input part 45 so that the cell voltage signal corresponding to the between-electrodes voltage of the battery cells 21(b) to (d) (S120) is outputted to the first ADC 47, detects between-electrodes voltage of the battery cells 21(b) to (d) according to the cell voltage signal inputted from the first ADC 47, and stores the detected between-electrodes voltage of the battery cells 21(b) to (d) to the between-electrodes voltage storing areas V2 to V4 (S130). Then, after detecting the between-electrodes voltage of the forth battery cell 21(*d*) that is the last battery cell, the battery cell voltage detecting process ends (Y in S140). Each time the battery cell voltage detecting process is executed, the between-electrodes voltage of the battery cell 21 to be stored in the areas V1 to V4 is updated.

The CPU 51 executes the battery cell temperature detecting process (FIG. 8) at a predetermined intervals.

Specifically, the second ADC 48 has the cell temperature signal of the temperature sensor 34(A) input thereto. Then, in the second ADC 48 the cell temperature signal is quantized and digitized, and the digitized cell temperature signal is inputted to the CPU 51 via the external interface.

The CPU 51 detects the temperature of the battery cell 21 based on the cell temperature signal inputted from the second ADC 48 (T110). Then, the detected temperature of the battery cell 21 is stored into an area T1 corresponding to the plurality of battery cells 21 on the RAM 53 (T120), and the battery cell temperature detecting process ends. Each time the battery cell temperature detecting process is executed, the temperature of the battery cell 21 to be stored in the areas T1 is updated.

The CPU 51 also executes the battery state data sending process (FIG. 9).

The CPU 51 waits until receiving a routine battery state data sending command from the battery state monitoring unit 60 via the communication module 55 (N in U110). Then, when receiving the battery state sending command (Yin U110), the CPU 51 reads the between-electrodes voltage of each battery cell 21 from the aforementioned between-electrodes voltage of each battery cell 21 from the between-electrodes voltage storing areas V1 to V4, as well as the temperature of the battery cell 21 from the temperature storing area T1, and generates the battery state data including these between-electrodes voltage and the temperature (U120). Herein the generated battery state data is provided as digital signal. Namely, the CPU 51 corresponds to a data generator in the claims. Then, the generated battery state data is sent to the battery state monitoring unit 60 via the communication module 55 (U130). Hereinafter, the aforementioned process is repeated.

The CPU 51 also executes the battery cell discharging process in parallel to the aforementioned battery cell discharging process.

The CPU 51 waits until receiving a routine battery cell discharging command from the battery state monitoring unit 60 via the communication module 55. This battery cell discharging command includes a cell designating data designating the battery cell 21 of discharging. Then, the CPU 51, when receiving the battery cell discharging command, sends control signal to the discharging switch SW to set the discharging switch closed for a given period before open, corresponding to the battery cell 21 designated by the cell designating data included in the command. This makes the battery cell 21 discharge that is designated by the battery cell discharging command.

The present embodiment has the battery cell voltage detecting process (FIG. 7), the battery cell temperature detecting process (FIG. 8), and the battery state data sending process (FIG. 9) executed in parallel, but is not limited to this configuration. For example, the battery cell voltage detecting process and the battery cell temperature detecting process, without their being executed independently at intervals, may be executed within the battery state data sending process. Specifically, in the battery state data sending process, just after receiving the aforementioned battery state data sending command, the battery cell voltage detecting process and the battery cell temperature detecting process may be executed, then the between-electrodes voltage and the temperature of the battery cell may be executed before the battery state data is generated.

Figure 11:
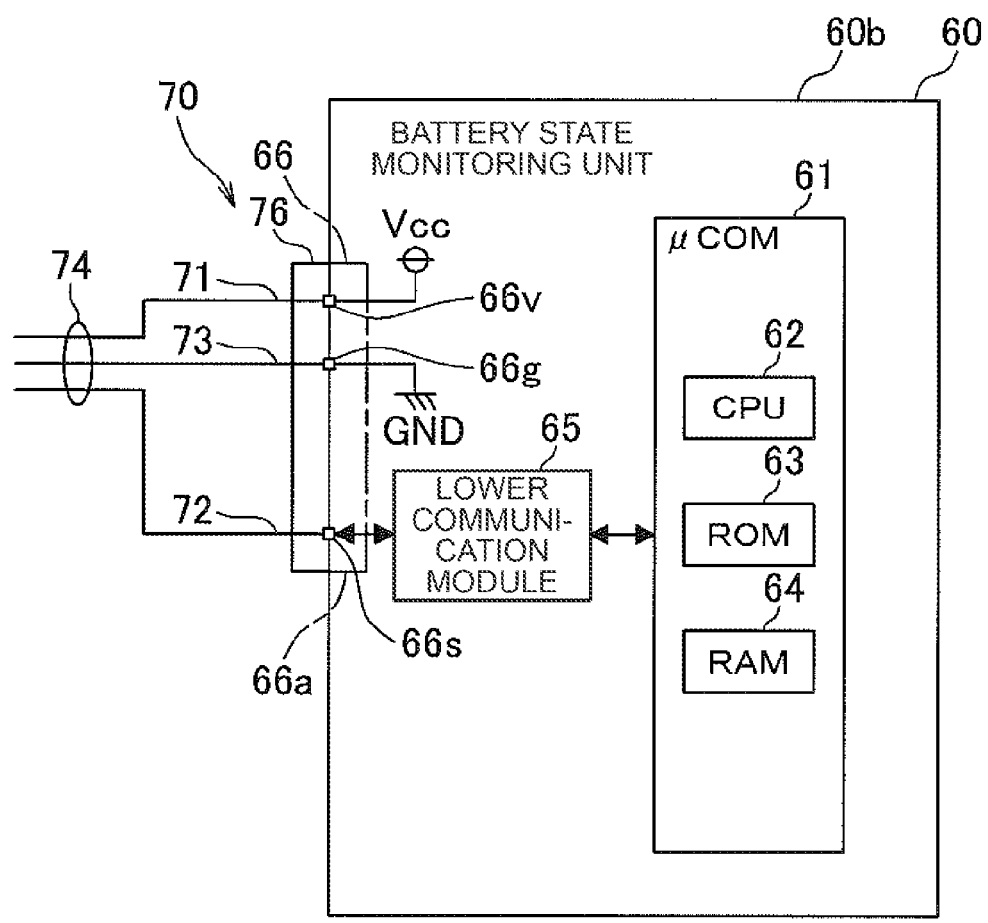
FIG. 11 is a functional block chart illustrating a battery state monitoring unit the battery power system in FIG. 1 includes.

The battery state monitoring unit 60, as shown in FIG. 1, includes a box-like unit case 60*a* in which the board 60*b* is housed to which various electric components are mounted (FIG. 11). In the present embodiment the battery state monitoring unit 60 is secured to the battery module 20 of one of the battery pack 10(1) among the plurality of battery packs 10.

One surface of the unit case 60*a* includes a connector 66 mentioned shortly engaging with a second harness connector 76 of the wire harness 70 disposed. The connector 66 is provided with a connector housing 66*a*, terminal fittings 66*v*, 6*g*, 66*s* housed in the connector housing 66*a*. The terminal fitting 66*v* has a power source wired pattern of the board 60*b* aforementioned (namely, the power source voltage Vcc (FIG. 11)) connected thereto, the terminal fitting 66*g* has the ground wired pattern of the board 60*b* (namely, the ground GND (FIG. 1)) connected thereto, the terminal fitting 66*s* has the lower communication module 65 mentioned later connected thereto via wired pattern.

FIG. 11 illustrates functional block diagram of the battery state monitoring unit 60. As shown in FIG. 11 the battery state monitoring unit 60 includes a microprocessor 61 (hereinafter refereed to as "μCOM 61"), and a lower communication module 65. The battery state monitoring unit 60 is supplied with power from the low-voltage power source to operate. Namely, the power source wired pattern (namely, the power source voltage Vcc) and the ground wired pattern (namely, the ground GND) on the board of the battery state monitoring unit 60 are connected with the low-voltage power source aforementioned.

The μCOM 61 includes a central processing unit (CPU) 62 executing various processes or controls according to preliminarily defined programs, a read-only memory ROM 63 in which processing programs or various datum for the CPU 62 are stored, a random access memory RAM 64 storing various datum and including a memory required for processing work of the CPU 62, and a not-shown external interface. The ROM 63 has processing program stored therein that works the CPU 62 as various means such as data generating means. The CPU 62 functions as the various means aforementioned by executing processing programs. The external interface is also connected with the lower communication module 65.

The lower communication module 65 is configured operable to communicate using LIN (Local Interconnect Network) protocol that is the aforementioned serial multi communication protocol. The lower communication module 65 is located between the μCOM 61 and the terminal fitting 66*s* of the connector 66. The lower communication module 65 is connected with the common signal line 72 of the wiring harness 70 via the terminal fitting 66*s*.

The lower communication module 65 communicates on LIN using the common signal line 72 between the plurality of battery state monitoring units 39 (namely, the plurality of subunits 40) connected with the common signal line 72. The lower communication module 65 outputs various datum such as battery state data sent from each battery state notifying unit 39 via the common signal line 72 to the μCOM 61, and outputs various datum such as command sent from the μCOM 61 to the battery state notifying unit 72 via the common signal line.

The external interface is also connected with the not-shown upper communication module. This upper communication module is configured operable to communicate on such known CAN (Controller Area Network) protocol, sending and receiving various data between the electric control devices mounted to the automobile.

Then, one exemplified operation is discussed relating to the present invention of the aforementioned battery state monitoring unit 60.

The battery state monitoring unit 60 (namely, the CPU 62 of the μCOM 61) monitors the plurality of battery packs 10(1) to (3). Firstly, the battery state monitoring unit 60 sends the battery state data sending command aforementioned via the lower communication module 65 for the subunit 40(A) of the battery state notifying unit 39(1).

Then, when the battery state data is received from the subunit 40(A) to which the battery state data sending command is sent, it is determined based on the between-electrodes voltage and the temperature of the battery cell 21 included in the battery state data whether or not the battery cell 21 required for discharge exists. Then, if the battery cell rewired for discharge exists is determined, then the battery cell discharging command including cell designating data designating battery cell 21 required for discharge is sent to the subunit 40(A) from which the battery state data is sent. Subsequently, for other subunits 40(B), (C) of the battery state notifying unit 39(1) the same process as mentioned above is executed in series. Then, after process ends for the subunits 40(A) to (C) of the battery state notifying unit 39(1), the same process for the battery state notifying units 39(2), (3) is executed. Subsequently, at predetermined intervals the same process as mentioned above is repeated.

The wiring harness 70 is provided with a power source line 71 as a plurality of cables, a cable 74 composed of the common signal line 72 and the ground line 73, a first harness connector 75, and a second harness connector 76. Provided in the present embodiment are a wiring harness 70(1) connecting the battery state monitoring unit 60 and the battery state notifying unit 39(1), a wiring harness 70(2) connecting the battery state notifying units 39(1), (2), and a wiring harness 70(3) connecting the battery state notifying units 39(2), (3).

The power source line 71, the common signal line 72, and the ground line 73 are each made of covered cable, one end of which is each connected to the plurality of terminal fittings of the first harness connector 75 disposed corresponding to each cable, the other end of which is each connected to the plurality of terminal fittings of the second harness connector 76 disposed corresponding to each cable.

The first harness connector 75 is configured engageable with a second connector 59 mentioned later of the subunit 40, the second harness connector 76 the first connector 58 of the subunit 40 and the connector 66 of the battery state monitoring unit 60.

When the first harness connector 75 is engaged with the second connector 59, the power source line 71 is, as shown in FIG. 6A, connected to the male-type terminal fitting 59v, the ground line 73 the male-type terminal fitting 59g, the common signal line 72 the male-type terminal fitting 59s.

When the second harness connector 76 is engaged with the first connector 58, the power source line 71 is connected to the male-type terminal fitting 58v, the ground line 73 the male-type terminal fitting 58g, the common signal line 72 the male-type terminal fitting 58s. Also, when the first second connector 76 is engaged with the connector 66 of the battery state monitoring unit 60, the power source line 71 is, as shown in FIG. 11, connected to the terminal fitting 66v, the ground line 73 the terminal fitting 66g, the common signal line 72 the terminal fitting 66s.

Figure 12:
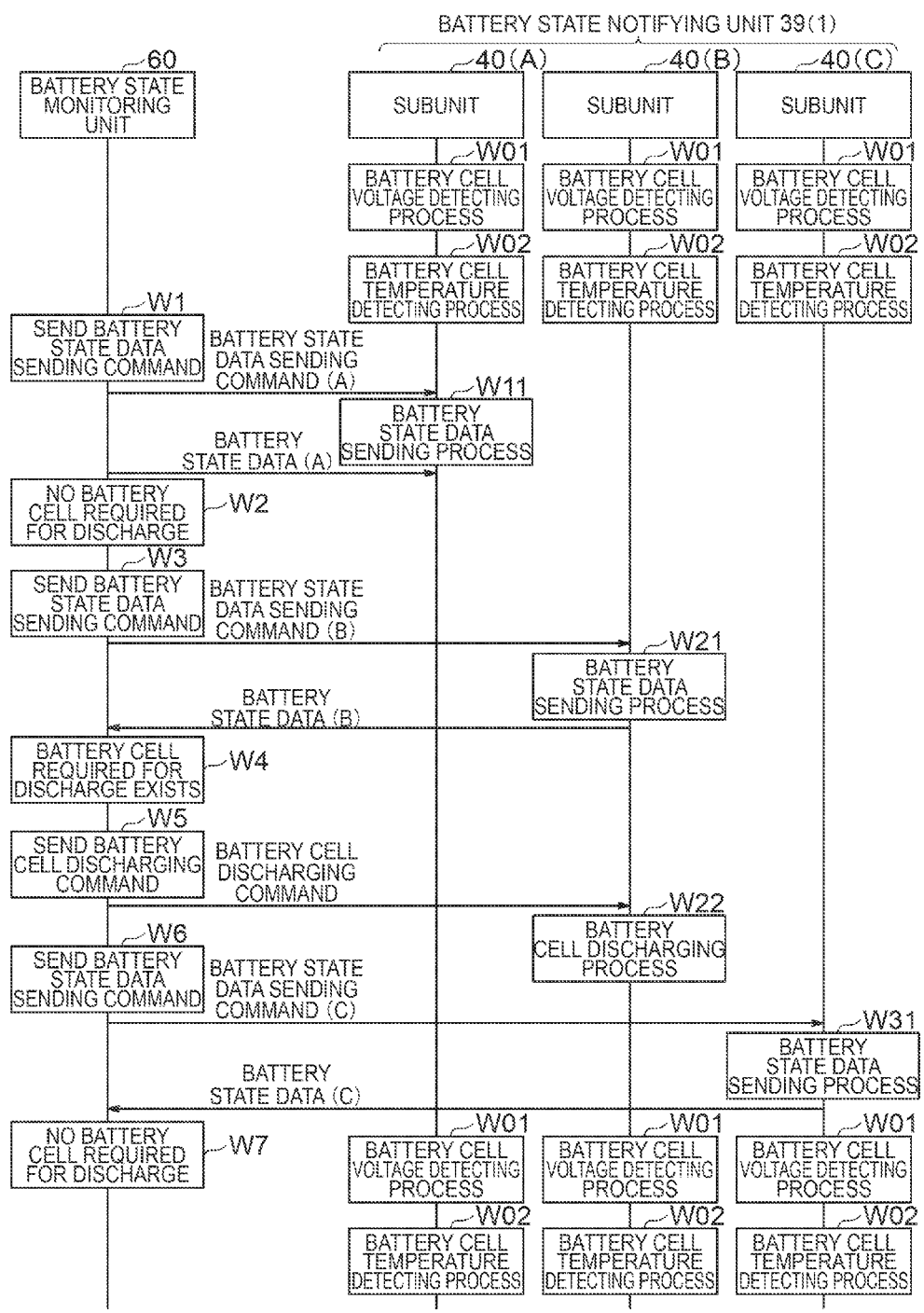
FIG. 12 is a sequential chart illustrating one example of operation of the battery power system in FIG. 1.

Then, with reference to FIG. 12 one exemplified operation is discussed of the aforementioned battery power source system 1.

The subunit 40(A) to (C) of the battery state notifying unit 39(1) disposed to the plurality of battery packs 10 executes at the predetermined intervals the battery cell voltage detecting process and the battery cell temperature detecting process aforementioned and stores the between-electrodes voltage and the temperature of the battery cell 21 to the RAM 53 (W01, W02).

The battery state monitoring unit 60 sends the battery state data sending command (A) to the subunit 40(A) of the battery state notifying unit 39(1) of the battery pack 10(1) among the plurality of battery packs 10. The subunit 40(A) receiving the battery state data sending command (A) executes the battery state data sending command, and sends the battery state data (A) to the battery state monitoring unit 60 (W11). Then, the battery state monitoring unit 60, when determining based on the battery state data (A) no battery cell required for discharge exists, proceeds to the next step (W2).

Then, the battery state monitoring unit 60 sends the battery state data sending command (B) to the subunit 40(B) of the battery state notifying unit 39(1)(W3). The subunit 40(B) having received this battery state data sending command (B) executes the battery state data sending process, and sends the battery state data (B) to the battery state monitoring unit 60 (W21). Then, the battery state monitoring unit 60, when determining based on the battery state data (B) the battery cell rewired for discharge exists, sends the battery cell discharging command including cell designating data designating battery cell 21 required for discharge to the battery state notifying unit (B) and proceeds to the next step (W5). The battery state notifying unit (B) having received this battery cell discharging command executes the battery cell discharging process (W22).

Then, the battery state monitoring unit 60 sends the battery state data sending command (C) to the subunit 40(C) of the battery state notifying unit 39(1) (W6). The subunit 40(C) having received this battery state data sending command (C) executes the battery state data sending process, and sends the battery state data (C) to the battery state monitoring unit 60 (W31). Then, the battery state monitoring unit 60, when determines based on the battery state data (C) no battery cell required for discharging exists, proceeds to the next step (W7) as completion of process relating to the battery pack 10(1).

Subsequently, the battery state monitoring unit 60 likewise obtains the battery state data for all the other battery packs (2), (3) from each subunit 40 of the battery state notifying unit 39(2), (3), determines whether or not the battery cell exists required for discharging based on the battery state data, and executes, if required, discharging of the battery cell in the subunit 40.

Therefore, according to the present embodiment, since the plurality of subunits 40 is provided corresponding to every battery cell 21 (namely, every battery cell 22) of the predetermined unit S for the plurality of battery cells 21 the battery pack 10 includes, and these subunits 40 generates the battery state data composed of digital signal including the data indicating the state of the battery cell 21 corresponding to the subunit 40 based on the cell temperature signal corresponding to the voltage outputted from the cell voltage signal and the temperature sensor 34 corresponding to the between-electrodes voltage outputted from the bus bar 32 and the terminal fitting 33, expansion or reduction of the subunit 40 corresponding to the number of battery cell 21 the battery pack 10 includes allows the battery pack 10 different from that of the battery cell 21 to be also used, and thereby alteration of the number of the subunit 40 the battery state notifying unit 39 includes in conformity with the number of battery cell 21 of the battery pack 10 allows the battery state notifying unit 39 to be commonly used, reducing manufacturing cost.

Furthermore, since the subunit 40 is provided with the first connector 58 composing the data relay means, the second connector 59 disposed engageable with the first connector of the other subunit 40, the relay wired pattern 423 sending the battery state data between the first connector 58 and the second connector 59, connection in series of the plurality of subunits 40 allows the battery state data sent by each subunit 40 to integrate into one subunit 40 arranged at an end via each subunit 40, making possible only connection of the one subunit 40 with the subunit 40 of the external battery state monitoring unit 60 or the other battery state notifying unit 39, which is followed by ready connection to the external and improvement of assembling workability for devices or systems into which the battery state notifying unit 39 is set up. Furthermore, engagement of the first connector 58 and the second connector 59 between the subunits 40 allows the subunits 40 to connect in series to each other, and thus eliminating such wiring harness connecting the subunits 40 to each other, which is followed by improvement of assembling workability for the battery state notifying unit 39.

Furthermore, in the state monitoring unit 60, based on the battery state data sent from the battery state notifying unit 39 (namely, the subunit 40) of each battery pack, the state of battery pack 10 can be monitored, and thus it is made possible to reduce the plurality of cables in the wiring harness 70 to the number (three in the present embodiment) required for sending the battery state data composed of digital signal. Therefore, it is made possible to reduce the number of the plurality of cables of the wiring harness 70, and thus to facilitate designing for wiring or wiring work. Furthermore, since the battery state data composed of digital signal is sent to the battery state monitoring unit 60, the signal voltage to be sent can be set to low-voltage of the order of several volt. Thereby, it is made possible to facilitate electric designing such as safety/reliability designing like insulation or noise resistance in the battery state monitoring unit 60.

Furthermore, since the communication module of each subunit 40 is configured to send the battery state data to the battery state monitoring unit 60 using serial communication, it is made possible to, comparing to the case of using parallel communication, reduce the number of the plurality of cables of the wiring harness, and to facilitate designing for wiring and wiring workability of the wiring harness.

Furthermore, since both the battery state monitoring unit 60 and each subunit 40 are bus-connected to the logically-single signal (bus signal) composed of the relay wired pattern 423 of each subunit 40 and the common signal line 72 of the wiring harness, and the communication protocol of the communication module 55 is designed to be LIN protocol of the multi communication protocol using the bus signal line, even though the plurality of battery pack 10 is provided, the battery state monitoring unit 60 and the plurality of battery state notifying unit 39 are connected via the bus signal line, the battery state data can be sent to the battery state monitoring unit 60 from each subunit 40 of each battery state notifying unit 39 through the bus signal line. Therefore, it is eliminated to connect one-on-one between the battery state monitoring unit 60 and each subunit 40, reducing the plurality of cables of the wiring harness further, and facilitating the wiring designing and wiring work of the wiring harness 70 further.

Furthermore, since the battery pack 10 is provided with the bus bar module 30 including the plurality of bus bars 32 connecting the positive electrode 25 and the negative electrode 26 to each other of the plurality of battery cells 21, and the battery state notifying unit 39 is disposed to the bus bar module 30, it is made possible to set up the bus bar module 30 to the plurality of battery cell 21, and provide the battery state notifying unit with the battery pack 10, facilitating assembling workability of the battery pack 10.

Furthermore, since the battery state monitoring unit 60 is attached to one of the battery pack 10(1), it is made possible to shorten the wiring harness 70(1) connecting the battery state monitoring unit 60 and the battery state notifying unit 39(1) of the battery pack 10(1), facilitating further the wiring designing and wiring work of the wiring harness 70(1).

The present embodiment as mentioned above has each subunit 40 composing the battery state notifying unit 39 connect directly to each other through the first connector 58 and the second connector 59, but is not limited to this configuration, each subunit 40 composing the battery state notifying unit 39 may be connected to each other through wiring harness.

Figure 13:
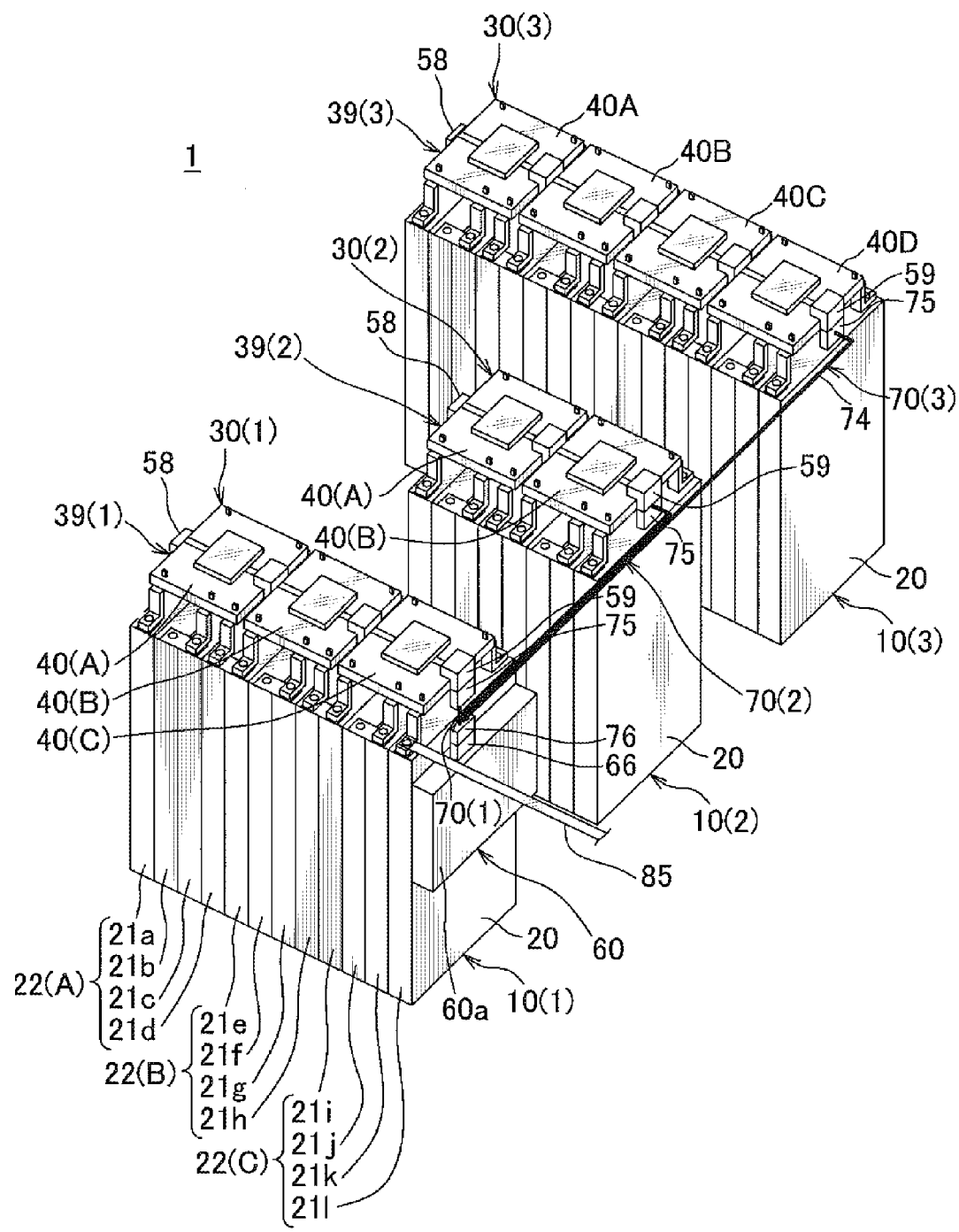
FIG. 13 is a perspective view illustrating configuration of a modified example of the battery power system in FIG. 1.
Figure 14:
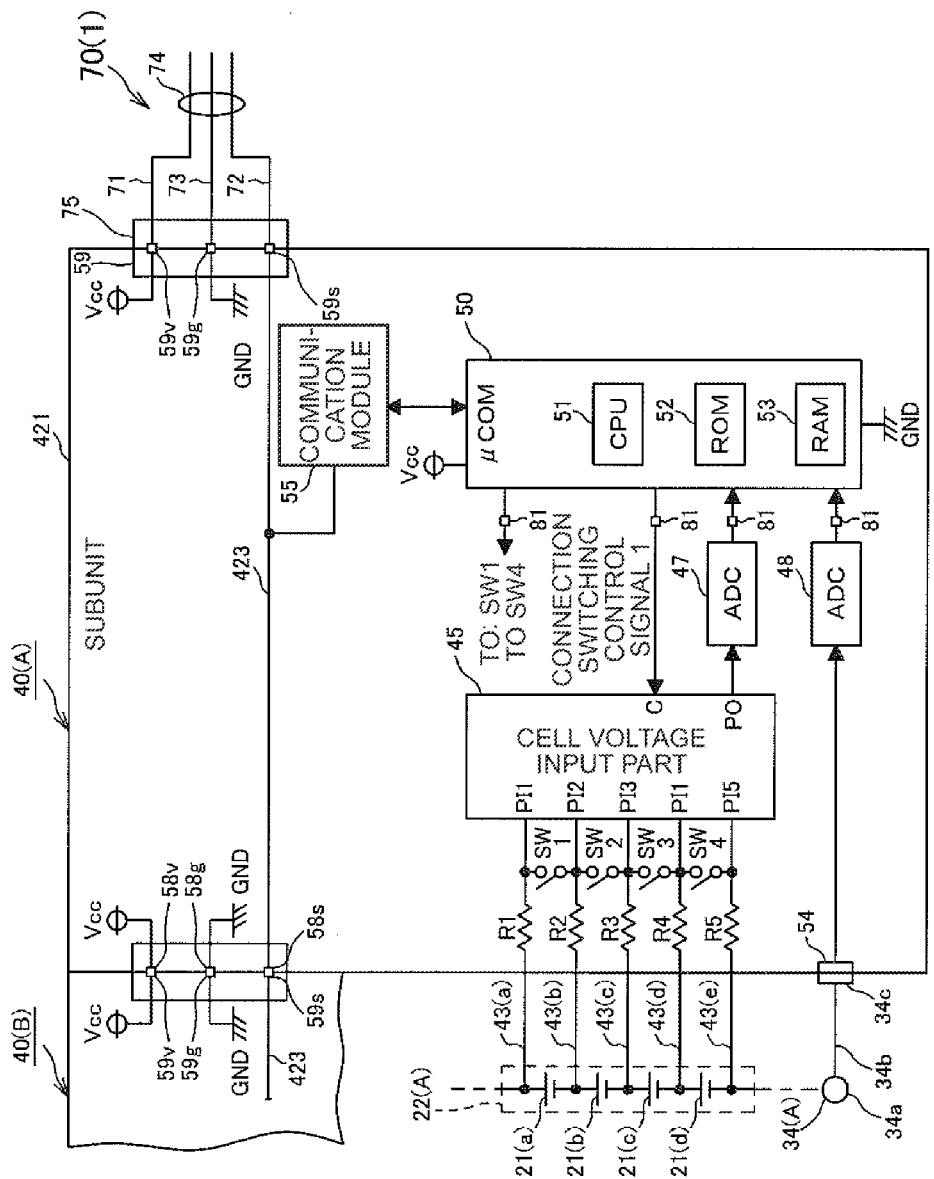
FIG. 14 is a functional block chart illustrating a configuration of a modified example of the subunit in FIG. 6A.

Furthermore, the present embodiment has the configuration in which the plurality of battery state notifying units 39 and the battery state monitoring unit 60 are connected through the single bus signal line composed of the relay wired pattern 423 and the common signal line, but is not limited to this configuration. For example, the plurality of lower communication module 65 may be disposed to one of the battery state monitoring unit 60, and as shown in FIG. 13, the battery state monitoring unit 60 and the plurality of battery packs 10 (namely the battery state notifying unit 39) may be connected on one-on-one basis.

Furthermore, the present invention has each subunit 40 and the battery state monitoring unit 60 communicate on LIN protocol that is serial multi communication protocol, but is not limited to this configuration. It may be configured to communicate using protocol other than LIN, such as CAN (Controller Area Network) protocol. Furthermore, parallel communication may be used between each subunit 40 and the battery state monitoring unit 60.

Furthermore, the present invention has the flying capacitance circuit disposed to the cell voltage input part 45 of the subunit, and the high-voltage section (that is, high-voltage power source) and the low-voltage section (that is, low-voltage power source) separated, and the high-voltage analog signal converted into the low-voltage analog signal, but is not limited to this configuration. For example, the present embodiment as mentioned above, as shown in FIG. 14, has the cell voltage input part 45 composed of only the multiplexer circuit, and has the cell voltage input part 45, the first ADC 47, the second ADC 48, and the temperature sensor 34 operate with the high-voltage power source composed of the battery back 10 to which the subunit 40 is disposed, in addition, (i) between the first ADC 47 and the second ADC 48, and the μCOM 50, (ii) between the μCOM 50 and the cell voltage input part 45, (iii) between the COM 50 and the discharging switches SW1 to SW4, may be disposed insulating element 81 such as photo coupler. This allows the section operative with high-voltage power source (the cell voltage input part 45, the first ADC 47, the second ADC 48, the temperature sensor 34, and the discharging switch SW1 to SW4), and the section operative with the low-voltage power source (the μCOM 50 and the communication module 55) to separate, and data communication between each section to operate.

Furthermore, the present embodiment has the subunit 40 supplied with the lower-voltage power source from the battery state monitoring unit 60, and has the configuration which operates with the lower-voltage power source, but not limited to this configuration, the subunit 40 may wholly be configured to operate with the high-voltage power source composed of the battery pack 10 to which the subunit 40 itself is disposed.

Figure 15:
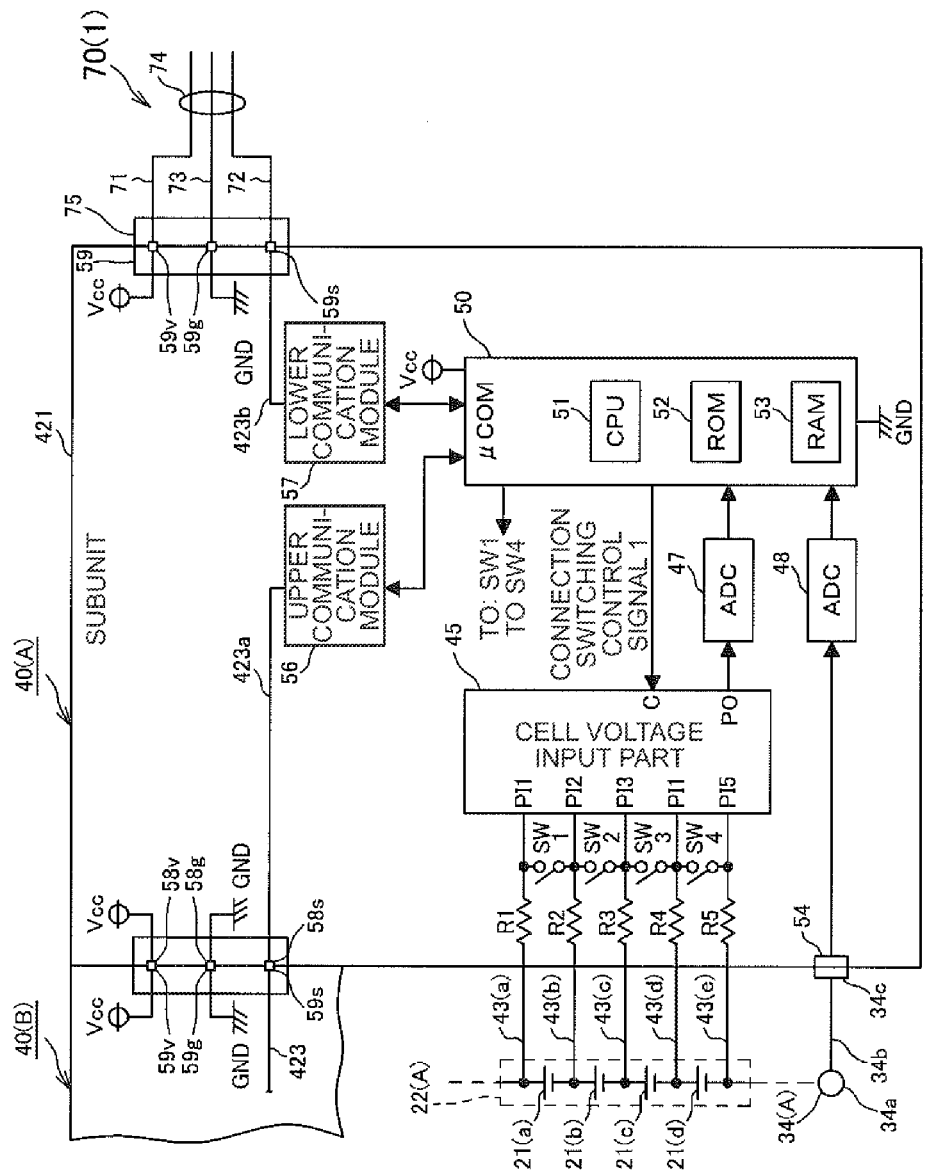
FIG. 15 is a functional block chart illustrating a configuration of other modified example of the subunit in FIG. 6A.
Figure 16:
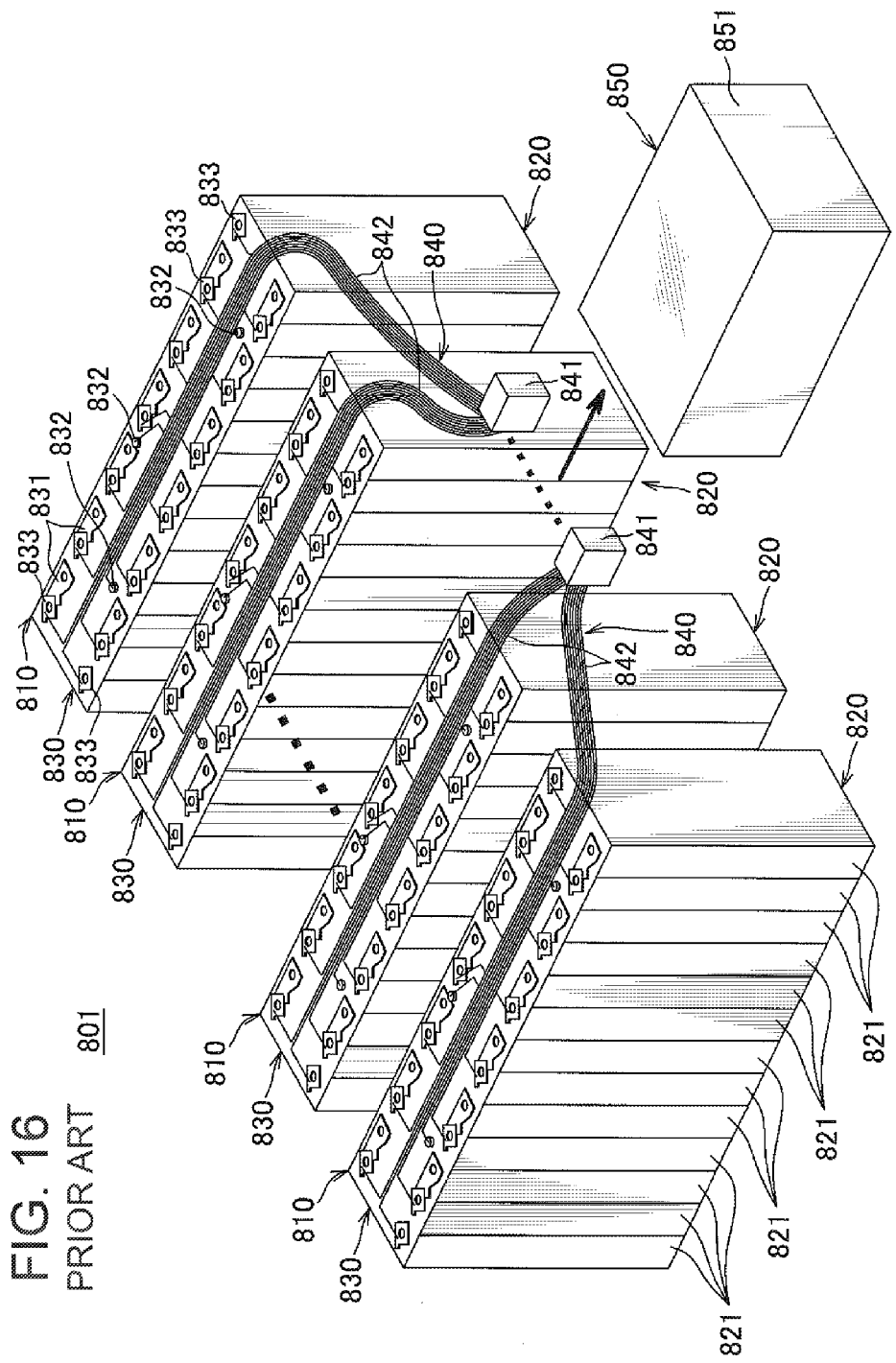
FIG. 16 is a perspective view illustrating a conventional high-voltage battery system.
Figure 17:
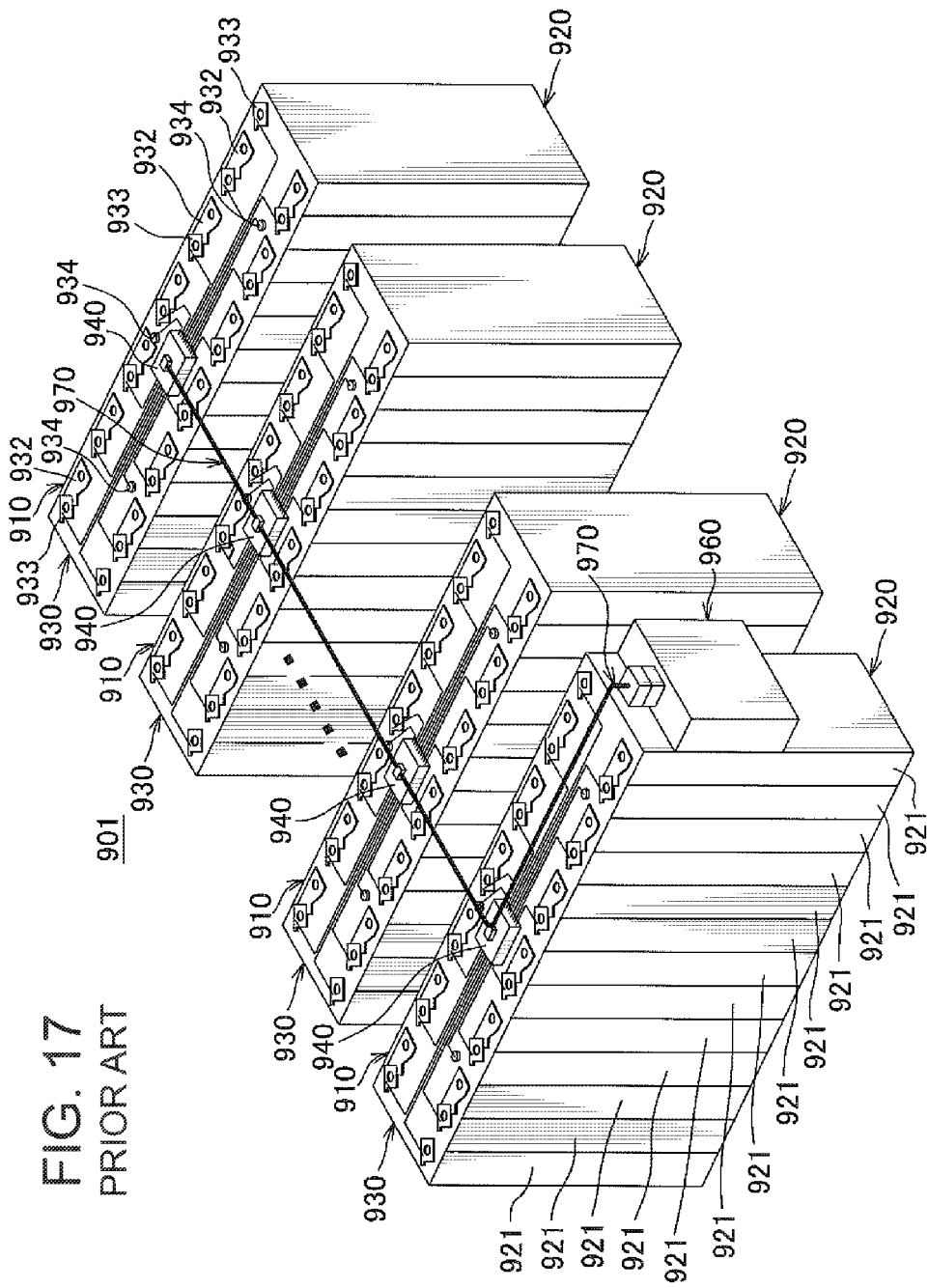
FIG. 17 is a perspective view illustrating other conventional high-voltage battery system.

In this case, in such the lower communication module 65 of the battery state monitoring unit 60, such insulating element is disposed that separates the high-voltage power source and the lower-voltage power source. Furthermore, each subunit 40 is, instead of bus connection under which the bus signal line aforementioned is suspended, configured to be in daisy chain connection. The subunit 40 has the upper communication 56 and the lower communication 57 disposed thereto as shown in FIG. 15. The higher communication module 56 is, by being connected to the female-type terminal fitting 58s of the first connector 58 via the relay wired pattern 423a, connected to the other high-voltage side subunit 40 further away from the battery state monitoring unit 60. The lower communication module 57 is, by being connected to the male-type terminal fitting 59s of the second connector 59 via the relay wired pattern 423b, is connected to either the other low-voltage side subunit 40 nearer to the battery state monitoring unit 60 or the battery state monitoring unit 60. Each subunit 40, which differs from each other in power source voltage, has level shift circuit (potential converting circuit) operable to send and receive signal between different power source voltages disposed in the upper communication module 56 and the lower communication module 57.

The μCOM 50, when receiving data from the other high-voltage side subunit 40 via the high-voltage side via the upper communication module 56, relays the date and sends to either the other lower-voltage side subunit 40 or the battery state monitoring unit 60 from the lower communication module 57. The μCOM 50, when receiving data from either the other side low-voltage subunit 40 or the battery state monitoring unit 60, relays the date if necessary, and sends the data to the high-voltage side subunit 40 via the upper communication module 56. In this configuration, the μCOM 50, the upper communication module 56, the lower communication module 57, and the relay wired patterns 423a, 423b compose the transmission part in the claims, this transmission part and the first connector 58 and the second connector 59 the data relaying device.

Furthermore, in the present embodiment battery power source system mounted to the hybrid vehicle is discussed, but the present invention is not limited to this configuration, and may be utilized in other than the automobile, for example, an emergency battery back-up power source system to be installed in such factory.

Note that the aforementioned embodiments only show typical configuration of the invention, the invention should not be limited to the embodiments. Namely, unless otherwise such changes and modifications depart from the scope of the present invention hereafter defined, they should be construed as being included therein.

The invention claimed is:

1. A battery state notifying unit that is disposed to a battery pack and connected to a battery state monitoring unit monitoring a state of the battery pack, the battery pack including
two or more battery sets each including a plurality of and a predetermined number of battery cells, and
a plurality of battery state outputting devices outputting an analog signal in accordance with a state of the battery cell, wherein,
the plurality of battery state outputting devices is disposed on an upper face of a case attached to the two or more battery sets, and
the battery state notifying unit comprises a plurality of subunits provided corresponding to every battery set, the plurality of subunits being engaged and connected to each other, and being disposed on the upper face of the case so as to cover the plurality of battery state outputting devices,
the subunits including
a data generator generating a battery state data including a digital signal having a data indicating the state of the battery cell included in the battery set corresponding to the subunits in accordance with the analog signal outputted from the battery state outputting device, and
a data transmitter transmitting the battery state data generated by the data generator to the battery state monitoring unit,
wherein the subunits further include a data relaying device relaying the battery state data transmitted by other subunit.

2. The battery state notifying unit as claimed in claim 1, wherein the data relaying device includes a first connector, a second connector engageable with the first connector of other subunit, and a transmitter transmitting the battery state data between the first connector and the second connector.

* * * * *